US010467093B2

(12) United States Patent
Werner et al.

(10) Patent No.: US 10,467,093 B2
(45) Date of Patent: *Nov. 5, 2019

(54) NON-VOLATILE MEMORY PROGRAM FAILURE RECOVERY VIA REDUNDANT ARRAYS

(71) Applicant: Seagate Technology LLC, Cupertino, CA (US)

(72) Inventors: Jeremy Isaac Nathaniel Werner, San Jose, CA (US); Earl T. Cohen, Oakland, CA (US)

(73) Assignee: Seagate Technology LLC, Cupertino, CA (US)

( * ) Notice: Subject to any disclaimer, the term of this patent is extended or adjusted under 35 U.S.C. 154(b) by 291 days.

This patent is subject to a terminal disclaimer.

(21) Appl. No.: 15/402,773

(22) Filed: Jan. 10, 2017

(65) Prior Publication Data
US 2017/0147435 A1 May 25, 2017

Related U.S. Application Data

(63) Continuation of application No. 13/728,573, filed on Dec. 27, 2012, now Pat. No. 9,569,320.

(51) Int. Cl.
G06F 11/00 (2006.01)
G06F 11/10 (2006.01)
(Continued)

(52) U.S. Cl.
CPC .......... *G06F 11/1068* (2013.01); *G06F 3/061* (2013.01); *G06F 3/064* (2013.01);
(Continued)

(58) Field of Classification Search
CPC ............. G06F 11/1068; G06F 11/1044; G06F 11/2056; G06F 11/108; G06F 3/0679;
(Continued)

(56) References Cited

U.S. PATENT DOCUMENTS 6,085,281 A * 7/2000 Kopp .................. G06F 9/24
365/185.33
6,308,007 B1 10/2001 Iwasaki
(Continued)

FOREIGN PATENT DOCUMENTS

CN 1435758 8/2003
JP H10283124 10/1998
(Continued)

OTHER PUBLICATIONS

Werner, Jeremy; Office Action for Japanese patent application No. 2013264768, filed Dec. 24, 2013, dated Oct. 17, 2017, 4 pgs.
(Continued)

Primary Examiner — Yair Leibovich
(74) Attorney, Agent, or Firm — Taylor English Duma LLP

(57) ABSTRACT

Methods, systems and computer-readable storage media for programming, by a storage controller, particular data stored in an allocated buffer to a particular one of a plurality of non-volatile memories (NVMs). Redundancy information may be updated sufficient to recover from failures of the plurality of NVMs. The allocated buffer may be freed prior to and independent of the particular NVM completing the programming. The particular data may continue to be programmed independent of freeing the allocated buffer. The continuing of the programming of the particular data may include determining whether there are any failures of the programming the particular data.

20 Claims, 15 Drawing Sheets

(51) Int. Cl.
*G06F 3/06* (2006.01)
*G06F 11/20* (2006.01)
*G11C 29/52* (2006.01)

(52) U.S. Cl.
CPC .......... *G06F 3/0619* (2013.01); *G06F 3/0656* (2013.01); *G06F 3/0679* (2013.01); *G06F 3/0688* (2013.01); *G06F 11/1044* (2013.01); *G06F 11/2056* (2013.01); *G11C 29/52* (2013.01); *G06F 11/108* (2013.01)

(58) Field of Classification Search
CPC ........ G06F 3/064; G06F 3/061; G06F 3/0688; G06F 3/0619; G06F 3/0656; G11C 29/52
USPC ......................................................... 714/6.21
See application file for complete search history.

(56) References Cited

U.S. PATENT DOCUMENTS

| | | | | |
|---|---|---|---|---|
| 9,569,320 | B2* | 2/2017 | Werner | G06F 11/2056 |
| 2002/0199136 | A1* | 12/2002 | Ku | G01R 31/3187 714/30 |
| 2005/0223135 | A1* | 10/2005 | Kotani | G06F 13/28 710/22 |
| 2009/0164704 | A1 | 6/2009 | Kanade et al. | |
| 2010/0023800 | A1 | 1/2010 | Harari et al. | |
| 2010/0185921 | A1* | 7/2010 | Meller | G06F 8/654 714/763 |
| 2011/0170334 | A1 | 7/2011 | Park et al. | |
| 2012/0254504 | A1 | 10/2012 | Syu et al. | |
| 2014/0189421 | A1 | 7/2014 | Werner et al. | |

FOREIGN PATENT DOCUMENTS

| | | |
|---|---|---|
| JP | 2005293427 | 10/2005 |
| JP | 2013131095 | 7/2013 |
| WO | 2012099937 | 1/2012 |

OTHER PUBLICATIONS

Werner, Jeremy Isaac Nathaniel; Issue Notification for U.S. Appl. No. 13/728,573, filed Dec. 27, 2012, dated Jan. 25, 2017, 1 page.
Werner, Jeremy; Notice of Allowance for Chinese Patent Application No. 201310739979, filed Dec. 26, 2013, dated Jan. 26, 2017, 2 pgs.
LSI Corporation, European Search Report for serial No. 13196184.9, filed Dec. 9, 2013, dated Apr. 6, 2017, 4 pgs.
Seagate Technology, LLC; Office Action for Chinese Application No. 201310739979.X, filed Dec. 26, 2013, dated May 9, 2016, 8 pgs.
Werner, Jeremy Isaac Nathaniel; Final Office Action for U.S. Appl. No. 13/728,573, filed Dec. 27, 2012, dated May 29, 2015, 14 pgs.
Werner, Jeremy Isaac Nathaniel; Non-Final Office Action for U.S. Appl. No. 13/728,573, filed Dec. 27, 2012, dated Apr. 4, 2016, 12 pgs.
Werner, Jeremy Isaac Nathaniel; Non-Final Office Action for U.S. Appl. No. 13/728,573, filed Dec. 27, 2012, dated Sep. 11, 2014, 9 pgs.
Werner, Jeremy Isaac Nathaniel; Notice of Allowance for U.S. Appl. No. 13/728,573, filed Dec. 27, 2012, dated Oct. 5, 2016, 17 pgs.
LSI Corporation; Decision to Dismiss an Amendment for Korean application No. 10-2013-0162679, dated May 26, 2016, 4 pgs.
LSI Corporation; Extended European Search Report for serial No. 13196184.9, filed Dec. 9, 2013, dated Apr. 16, 2015, 9 pgs.
LSI Corporation; Office Action for Taiwan application No. 102145669, filed Dec. 11, 2013, dated Jul. 23, 2015, 5 pgs.
Wikepedia definition of ECC, retrieved from http://en.wikipedia.org/wiki/Forward_error_correction on May 27, 2015, see "how it works" section, 2 pgs.

\* cited by examiner $$R0 = \sum_i Pi \qquad R1 = \sum_i Ki * Pi$$

Fig. 11

$$Pj = R0 - \sum_{i!=j} Pi$$

Fig. 12

$$R0' = \sum_{i!=m,n} Pi \qquad R1' = \sum_{i!=m,n} Ki * Pi$$

Fig. 13A $$R0 = R0' + Pm + Pn$$
$$R1 = R1' + Km * Pm + Kn * Pn$$

Fig. 13B $$\Delta R0 = R0 - R0' = Pm + Pn$$
$$\Delta R1 = R1 - R1' = Km * Pm + Kn * Pn$$

Fig. 13C $$Pn = (\Delta R1 - \Delta R0 * Km)/(Kn - Km)$$
$$Pm = \Delta R0 - Pn$$

Fig. 13D

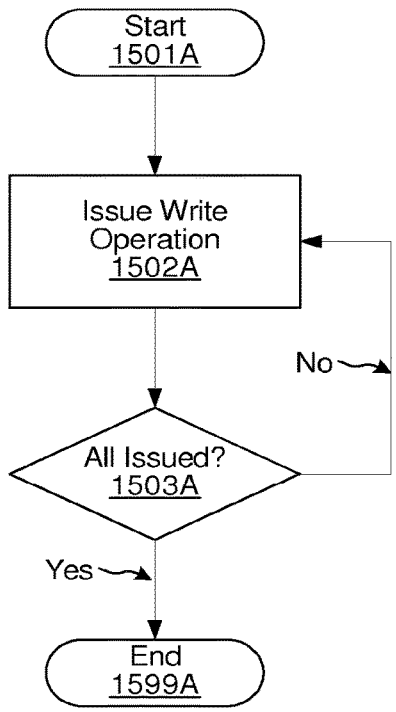
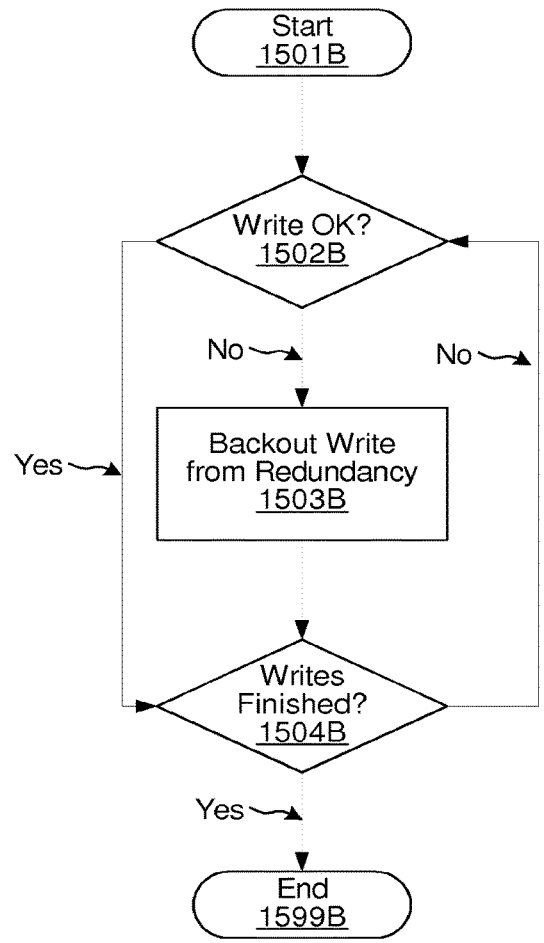
Fig. 15A              Fig. 15B
$$nR0 = R0 - Pj$$
$$nR1 = R1 - Kj * Pj$$
Fig. 15C

NON-VOLATILE MEMORY PROGRAM FAILURE RECOVERY VIA REDUNDANT ARRAYS

CROSS-REFERENCE TO RELATED APPLICATIONS

The present application is a continuation of U.S. non-provisional application Ser. No. 13/728,573, filed Dec. 27, 2012, now U.S. Pat. No. 9,569,320, entitle NON-VOLATILE MEMORY PROGRAM FAILURE RECOVERY VIA REDUNDANT ARRAYS, wherein the foregoing application is incorporated by reference in its entirety for all purposes. To the extent permitted by the type of the instant application, this application incorporates by reference for all purposes the following applications, all commonly owned with the instant application at the time the invention was made:

U.S. Provisional Application Ser. No. 61/418,846, filed Dec. 1, 2019, first named inventor Jeremy Isaac Nathaniel WERNER, and entitled DYNAMIC HIGHER-LEVEL REDUNDANCY MODE MANAGEMENT WITH INDEPENDENT SILICON ELEMENTS.

U.S. Provisional Application Ser. No. 61/433,918, filed Jan. 18, 2011, first named inventor Jeremy Isaac Nathaniel WERNER, and entitle HIGHER-LEVEL REDUNDANCY INFORMATION COMPUTATION;

PCT Application Serial No. PCT/US11/062,762, filed Nov. 30, 2011, first named inventor Jeremy Isaac Nathaniel WERNER, and entitled DYNAMIC HIGHER-LEVEL REDUNDANCY MODE MANAGEMENT WITH INDEPENDENT SILICON ELEMENTS; and PCT Application Serial No. PCT/US12/21682, filed Jan. 18, 2012, first named inventor Jeremy Isaac Nathaniel WERNER, and entitled HIGHER-LEVEL REDUNDANCY INFORMATION COMPUTATION.

BACKGROUND

Field

Advancements in non-volatile storage technology and manufacturing are needed to provide improvements in cost, profitability, performance, efficiency, and utility of use.

Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, e.g., as a process, an article of manufacture, an apparatus, a system, a composition of matter, and a computer readable medium such as a computer readable storage medium (e.g., media in an optical and/or magnetic mass storage device such as a disk, an integrated circuit having non-volatile storage such as flash storage), or a computer network wherein program instructions are sent over optical or electronic communication links. The Detailed Description provides an exposition of one or more embodiments of the invention that enable improvements in cost, profitability, performance, efficiency, and utility of use in the field identified above. The Detailed Description includes an Introduction to facilitate understanding of the remainder of the detailed description. The Introduction includes Example Embodiments of one or more of systems, methods, articles of manufacture, and computer readable media in accordance with concepts described herein. As is discussed in more detail in the Conclusions, the invention encompasses all possible modifications and variations within the scope of the issued claims.

BRIEF DESCRIPTION OF DRAWINGS

FIG. 11 illustrates selected details of an embodiment of higher-level redundancy information computations.

FIG. 12 illustrates selected details of an embodiment of recovery from one (lower-level) failure (during a single operation).

FIGS. 13A-13D illustrate selected details of an embodiment of recovery from two (lower-level) failures (during a single operation).

FIGS. 15A-15C illustrate selected details of an embodiment of backing out of a computation of higher-level redundancy information with respect to a write provided to NVMs.

Figure 1A:
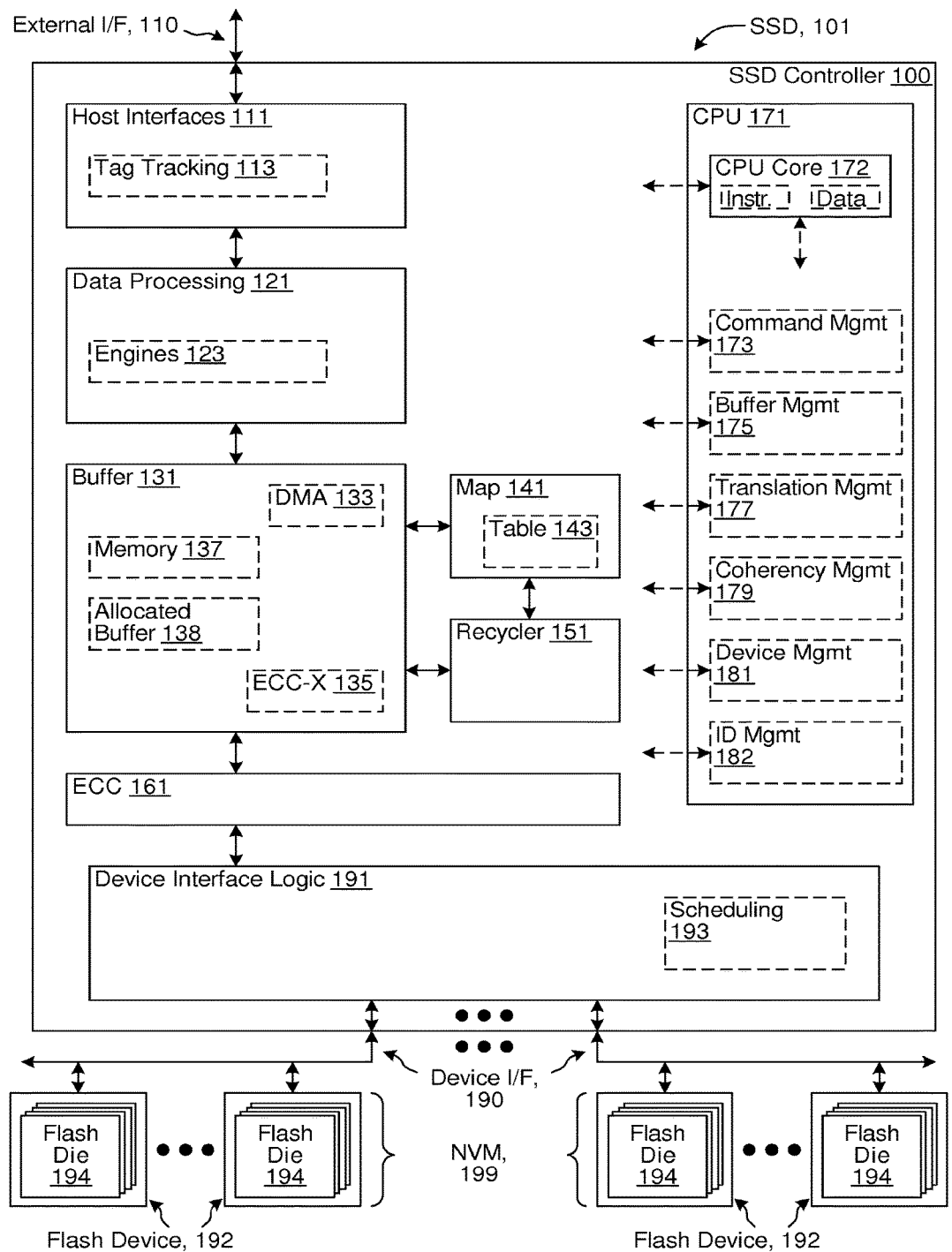
FIG. 1A illustrates selected details of an embodiment of a Solid-State Disk (SSD) including an SSD controller providing program failure recovery for Non-Volatile Memories (NVMs) via one or more (optionally internal) redundant arrays.

| List of Reference Symbols in Drawings | |
|---|---|
| Ref. Symbol | Element Name |
| 100 | SSD Controller |
| 101 | SSD |
| 102 | Host |
| 103 | (optional) Switch/Fabric/Intermediate Controller |
| 104 | Intermediate Interfaces |
| 105 | OS |
| 106 | FirmWare (FW) |
| 107 | Driver |
| 107D | dotted-arrow (Host Software ← → I/O Device Communication) |
| 109 | Application |
| 109D | dotted-arrow (Application ← → I/O Device Communication via driver) |
| 109V | dotted-arrow (Application ← → I/O Device Communication via VF) |
| 110 | External Interfaces |
| 111 | Host Interfaces |
| 112C | (optional) Card Memory |
| 113 | Tag Tracking |
| 114 | Multi-Device Management Software |
| 115 | Host Software |
| 116 | I/O Card |
| 117 | I/O & Storage Devices/Resources |
| 118 | Servers |
| 119 | LAN/WAN |
| 121 | Data Processing |
| 123 | Engines |
| 131 | Buffer |
| 133 | DMA |
| 135 | ECC-X |
| 137 | Memory |
| 138 | Allocated Buffer |
| 141 | Map |
| 143 | Table |
| 151 | Recycler |
| 161 | ECC |
| 171 | CPU |
| 172 | CPU Core |
| 173 | Command Management |
| 175 | Buffer Management |
| 177 | Translation Management |
| 179 | Coherency Management |
| 180 | Memory Interface |
| 181 | Device Management |
| 182 | Identity Management |
| 190 | Device Interfaces |
| 191 | Device Interface Logic |
| 192 | Flash Device |
| 193 | Scheduling |
| 194 | Flash Die |
| 199 | NVM |
| 211 | LBA |
| 213 | LPN |
| 215 | Logical Offset |
| 221 | Map Info for LPN |
| 223 | Read Unit Address |
| 225 | Length in Read Units |
| 311 | Read Data |
| 313 | First Read Unit |
| 315 | Last Read Unit |
| 401A | Read Unit |
| 401B | Read Unit |
| 410B | Header Marker (HM) |
| 411A | Header 1 |
| 411B | Header 1 |
| 412B | Header 2 |
| 419A | Header N |
| 419B | Header N |

| List of Reference Symbols in Drawings | |
|---|---|
| Ref. Symbol | Element Name |
| 421A | Data Bytes |
| 421B | Data Bytes |
| 422B | Data Bytes |
| 429B | Data Bytes |
| 431A | Optional Padding Bytes |
| 431B | Optional Padding Bytes |
| 501 | Header |
| 511 | Type |
| 513 | Last Indicator |
| 515 | Flags |
| 517 | LPN |
| 519 | Length |
| 521 | Offset |
| 600 | Striping Direction |
| 610.0, 610.1, 610.61, 610.62, 610.63, 610.64, 610.65 | Flash Die |
| 610.0B0, 610.0B1, 610.0B2, 610.0BB, 610.1B0, 610.1B1, 610.1B2, 610.1BB, 610.63B0, 610.63B1, 610.63B2, 610.63BB, 610.64B0, 610.64B1, 610.64B2, 610.64BB, 610.65B0, 610.65B1, 610.65B2, 610.65BB | Blocks |
| 610.0P0, 610.0P1, 610.0P2, 610.0PP, 610.63P0, 610.63P1, 610.63P2, 610.63PP, 610.64P0, 610.64P1, 610.64P2, 610.64PP, 610.65P0, 610.65P1, 610.65P2, 610.65PP | Pages |
| 610.0R0, 610.0R1, 610.0RR, 610.1R0, 610.1R1, 610.1RR, 610.65R0, 610.65R1, 610.65RR | Read Units (RUs) |
| 660.0, 660.1, 660.2, 660.R | R-blocks |
| 720 | Flash Device(s) |
| 730 | Interface Channel(s) |
| 740 | Extra Flash Device(s) |
| 750 | Extra Interface Channel(s) |
| 801 | Start |
| 802 | Operate in First Higher-Level Redundancy Mode |
| 803 | Failure? |
| 804 | Reduce Free Space |

-continued

| List of Reference Symbols in Drawings | |
|---|---|
| Ref. Symbol | Element Name |
| 805 | Rearrange Data Storage |
| 806 | Recover/Store Failed User Data |
| 807 | Determine/Store Revised Higher-Level Redundancy Information |
| 808 | Operate in Second Higher-Level Redundancy Mode |
| 809 | Dynamically Transition Operating Mode |
| 899 | End |
| 911, 931, 951, 971 | Read Unit |
| 911.E, 931.E, 951.E, 971.E | Lower-Level ECC |
| 911.U, 931.U, 951.U, 971.U | User Data |
| 1001 | Result |
| 1002 | Result |
| 1003 | Result |
| 1010 | R0 |
| 1011 | R1 |
| 1019 | Data |
| 1401A | Start |
| 1401B | Start |
| 1402A | Issue Read Operation |
| 1402B | Page Ready? |
| 1403A | All Issued? |
| 1403B | Perform Page-Based Computations |
| 1404B | Pages Finished? |
| 1499A | End |
| 1499B | End |
| 1501A | Start |
| 1501B | Start |
| 1502A | Issue Write Operation |
| 1502B | Write OK? |
| 1503A | All Issued? |
| 1503B | Backout Write from Redundancy |
| 1504B | Writes Finished? |
| 1599A | End |
| 1599B | End |
| 1610 | Controller |
| 1611 | Receive Data |
| 1612 | Data => Buffer |
| 1613 | (Begin) Program of NVM with Data |
| 1614 | Update Redundancy Information |
| 1615 | Free Buffer |
| 1616 | Delay |
| 1617 | (Begin) Program of NVM with Redundancy Information |
| 1618 | (Resume) Program of NVM with Data |
| 1619 | Update New Redundancy Information |
| 1620 | NVM |
| 1621 | Start: Program with Data |
| 1622 | Detect Failure(s) |
| 1623 | Complete: Program with Data |
| 1624 | Start: Program with Redundancy Information |
| 1625 | Resume: Program with Data |
| 1626 | Complete: Program with Data |

DETAILED DESCRIPTION

A detailed description of one or more embodiments of the invention is provided below along with accompanying figures illustrating selected details of the invention. The invention is described in connected with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (such as: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processed is alterable within the scope of the invention. Wherever multiple embodiments serve to describe variations in process, system, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

INTRODUCTION

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

At least some of the various shorthand abbreviations (e.g. acronyms) defined here refer to certain elements used herein.

| Acronym | Description |
|---|---|
| AHCI | Advanced Host Controller Interface |
| API | Application Program Interface |
| ATA | Advanced Technology Attachment (AT Attachment) |
| BCH | Bose Chaudhuri Hocquenghem |
| CD | Compact Disk |
| CF | Compact Flash |
| CMOS | Complementary Metal Oxide Semiconductor |
| CPU | Central Processing Unit |
| CRC | Cyclic Redundancy Check |
| DAS | Direct Attached Storage |
| DDR | Double-Data-Rate |
| DMA | Direct Memory Access |
| DNA | Direct NAND Access |
| DRAM | Dynamic Random Access Memory |
| DVD | Digital Versatile/Video Disk |
| DVR | Digital Video Recorder |
| ECC | Error-Correcting Code |
| eMMC | embedded MultiMediaCard |
| eSATA | external Serial Advanced Technology Attachment |
| GPS | Global Positioning System |
| HDD | Hard Disk Drive |
| I/O | Input/Output |
| IC | Integrated Circuit |
| IDE | Integrated Drive Electronics |
| JPEG | Joint Photographic Experts Group |
| LAN | Local Area Network |
| LBA | Logical Block Address |
| LDPC | Low-Density Parity-Check |
| LPN | Logical Page Number |
| MLC | Multi-Level Cell |
| MMC | MultiMediaCard |
| MPEG | Moving Picture Experts Group |
| NAS | Network Attached Storage |
| NCQ | Native Command Queuing |

| Acronym | Description |
| --- | --- |
| NVM | Non-Volatile Memory |
| ONA | Optimized NAND Access |
| ONFI | Open NAND Flash Interface |
| OS | Operating System |
| PC | Personal Computer |
| PCIe | Peripheral Component Interconnect express (PCI express) |
| PDA | Personal Digital Assistant |
| PHY | PHYsical interface |
| POS | Point Of Sale |
| RAID | Redundant Array of Inexpensive/Independent Disks |
| RASIE | Redundant Array of Silicon Independent Elements |
| ReRAM | Resistive Random Access Memory |
| RS | Reed-Solomon |
| SAN | Storage Attached Network |
| SAS | Serial Attached Small Computer System Interface (Serial SCSI) |
| SATA | Serial Advanced Technology Attachment (Serial ATA) |
| SCSI | Small Computer System Interface |
| SD | Secure Digital |
| SDR | Single-Data-Rate |
| SLC | Single-Level Cell |
| SMART | Self-Monitoring Analysis and Reporting Technology |
| SRAM | Static Random Access Memory |
| SSD | Solid-State Disk/Drive |
| UFS | Unified Flash Storage |
| USB | Universal Serial Bus |
| VF | Virtual Function |
| WAN | Wide Area Network |

NAND flash memory uses an array of floating gate transistors to store information. In SLC technology, each bit cell (e.g. floating gate transistor) is enabled to store one bit of information. In MLC technology, each bit cell is enabled to store multiple bits of information. As manufacturing technology (e.g. CMOS technology) scales down, each floating gate stores fewer electrons. Further, as storage capacity and density increase, each bit cell stores more bits. Therefore, values stored in the bit cells are represented by smaller voltage ranges. Uncertainties in sensing and/or changes in amount of stored electrons over time increase a probability for data to be stored or read incorrectly. Use of one or more redundancy and/or ECC techniques (e.g. at a lower-level) enables correct retrieval of otherwise corrupted data from NAND flash memory, overcoming, in some usage scenarios, some of the aforementioned difficulties.

Some types of SSDs use flash memory to provide non-volatile storage (e.g., the flash memory retains information without application of power). Use of one or more ECC and/or redundancy techniques (e.g. at a higher-level) enables correct retrieval of otherwise corrupted data from flash memory, and/or enables proper system-level operation of an SSD even when one or more flash memory elements fail intermittently or permanently.

For example, an SSD controller enables dynamic higher-level redundancy mode management with independent silicon elements to provide graceful degradation as one or more NVM (e.g. flash) elements fail during operation of an SSD implemented in part by the controller. A portion of the NVM is read. If an error occurs that is not correctable using lower-level redundancy and/or error correction (such as in accordance with one or more ECC techniques), then higher-level redundancy and/or error correction (such as in accordance with one or more RASIE techniques and/or dynamic higher-level redundancy mode management techniques) is used to attempt to correct the error. If a failure of one of the NVM elements is detected by the lower-level and/or the higher-level redundancy and/or error correction, and/or by other techniques (such as failing status reported by one or more of the NVM elements), then the higher-level redundancy and/or error correction is dynamically transitioned from operating in a current mode to operating in a new mode. The transition includes one or more of reducing free space available on the SSD, rearranging data storage of the SSD, recovering/storing failed user data (if possible), and determining/storing revised higher-level redundancy and/or error correction information. Operation then continues in the new mode. If another failure or another one of the NVM elements is detected with the higher-level redundancy and/or error correction now operating in the new mode, then another transition is made to another higher-level redundancy and/or error correction mode. Writing the NVM is in accordance with a higher-level redundancy and/or error correction operating mode, including determining/storing higher-level redundancy and/or error correction information in accordance with the higher-level redundancy and/or error correction operating mode and write data.

If greater than a threshold number and/or rate of lower-level error corrections and/or one or more failures occur for an area of memory, then optionally the area of memory is dynamically transitioned to operating in a new higher-level redundancy and/or error correction operating mode that is enabled to recover from more errors than a current higher-level redundancy and/or error correction operating mode. For example, if the current higher-level redundancy and/or error correction operating mode is none (e.g. no higher-level redundancy information is computed and/or used to recover from a failure of lower-level redundancy to correct an error), then the new higher-level redundancy and/or error correction operating mode is one that enables recovery from a single failure that is uncorrectable by the lower-level redundancy. For another example, if the current higher-level redundancy and/or error correction operating mode is one that enables recovery from a single failure that is uncorrectable by the lower-level redundancy, then the new higher-level redundancy and/or error correction operating mode is one that enables recovery from two failures that are uncorrectable by the lower-level redundancy.

Determining/storing higher-level redundancy and/or error correction information is in accordance, in some embodiments and/or usage scenarios, with computation of higher-level redundancy information. Higher-level redundancy information computation enables an SSD controller to provide higher-level redundancy capabilities to maintain reliable operation in a context of failures on non-volatile (e.g. flash) memory elements during operation of an SSD implemented in part by the controller. A first portion of higher-level redundancy information is computed using parity coding via an XOR of all pages in a portion of data (e.g. a stripe) to be protected by the higher-level redundancy information. A second portion of the higher-level redundancy information is computed using a weighted-sum technique, each page in the portion being assigned a unique non-zero "index" as a weight when computing the weighted-sum. Arithmetic is performed over a finite field (such as a Galois Field, or such as the integers mod p where p is a prime).

The portions of the higher-level redundancy information are computable in any order, such as an order determined by an order of completion of one or more read operations performed on NVM elements, or such as an order based on order of data returned and/or available from NVM elements, enabling, in various embodiments, reduced or eliminated buffering. The any order computability enables, in various embodiments, computing recovery data values and/or backing out of a write using relatively little temporary and/or intermediate buffering and/or state. The portions of the higher-level redundancy information are computable with any degree of parallelism, such as determined by available dedicated hardware elements, enabling, in various embodiments, reduced latency processing and/or reduced memory (e.g. NVM) bandwidth usage.

Higher-level redundancy information enables, in various embodiments and/or usage scenarios, recovery from failures to write/program NVM elements while providing higher programming bandwidth and/or reduced latency compared to some other techniques. While writing to the NVM elements, higher-level redundancy information (e.g. in accordance with one or more RASIE techniques) is maintained, such as by computing and then storing in an on-chip memory. The maintaining is sufficient to cover all data associated with in-progress write/program operations directed to the NVM elements. For example, data is in-progress from when the data is sent to the NVM elements for writing/programming up until the NVM elements indicate successful writing/programming of the data. As soon as data has been sent to the NVM elements for writing/programming and has been accumulated in the higher-level redundancy information being maintained to recover from write/program failures, buffering associated with the data is freed. Buffering associated with the higher-level redundancy information is retained until completion (or failure) of the writing/programming.

If there is write/program failure of one of the NVM elements, then in response the higher-level redundancy information is used to recover from the failure. Any data otherwise lost due to the failure is determined based on the higher-level redundancy information and all or any portions of previously (and successfully) written/programmed data. Optionally, all or any portions of the higher-level redundancy information maintained to recover from write/program failure of the NVM elements is written/programmed to the NVM elements (e.g. to enable recovery from lower-level failures during subsequent reading of the NVM elements).

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issues claims and their equivalents.

EC1) A method comprising:
  receiving, at a non-volatile memory controller, data to program N portions of a plurality of non-volatile memories, the data comprising particular data to program a particular one of the N portions;
  storing the particular data in an allocated buffer associated with the non-volatile memory controller;
  beginning programming the particular data to a particular one of the non-volatile memories;
  updating redundancy information sufficient to recover from failures of M of the N portions;
  freeing the allocated buffer;
  wherein at least one of the storing, the beginning programming the particular data, the updating redundancy information, and the freeing is in response to the receiving; and
  wherein the freeing is prior to the particular non-volatile memory completing the programming.

EC2) The method of EC1, wherein the redundancy information is first redundancy information, data has been received for a subset of the N portions, programming has not yet begun for the subset of the N portions, and further comprising:
  delaying programming of at least some of the subset of the N portions;
  beginning programming the first redundancy information to ones of the non-volatile memories;
  beginning programming of the at least some of the subset of the N portions;
  updating second redundancy information different from the first redundancy information and sufficient to recover from failures of M of the subset of the N portions; and
  wherein at least one of the delaying programming, the beginning programming the first redundancy information, the beginning programming of the at least some of the subset of the N portions, and the updating second redundancy information is in response to detecting a failure of the programming of the particular data.

EC3) The method of EC2, wherein the particular data is stored solely as encoded in the first redundancy information when the failure is detected.

EC4) The method of EC1, wherein the data further comprises initial data to program a first one of the N portions, and further comprising:
  initializing the redundancy information based at least in part on the initial data.

EC5) The method of EC1, wherein the non-volatile memory controller comprises the allocated buffer.

EC6) The method of EC1, wherein the allocated buffer is comprised in a first chip that is separate from a second chip that comprises the non-volatile memory controller.

EC7) The method of EC1, wherein the non-volatile memory controller is operable as a solid-state disk controller enabled to communicate with a computing host at least in part via a computing host interface compatible with a storage interface standard.

EC8) The method of EC1, wherein the non-volatile memory controller comprises a flash memory interface enable to communicate with the non-volatile memories.

EC9) A method comprising:
  receiving data to program N portions of a plurality of non-volatile memories;
  requesting initial programming of the N portions in accordance with the received data, the initial programming completing on a first part of the N portions prior to the initial programming starting on a second part of the N portions;
  in response to the requesting initial programming, updating redundancy information sufficient to recover from failures of M of the ones of the N portions for which initial programming was requested; and
  in response to identifying from one to M of the first part of the N portions that have failed the initial programming, requesting alternate programming of up to M alternate portion of the non-volatile memories in accordance with data calculated based at least in part on the redundancy information.

EC10) The method of EC9, wherein the redundancy information is first redundancy information, and further comprising:
  in response to the identifying, and in response to the requesting initial programming of each of the second part of the N portions, updating second redundancy information different from the first redundancy information.

EC11) The method of EC9, wherein the acts of the method are performed at least in part via a non-volatile memory controller that is operable as a solid-state disk controller enabled to communicate with a computing host at least in part via a computing host interface compatible with a storage interface standard.

EC12) The method of EC11, wherein the non-volatile memory controller comprises a flash memory interface enabled to communicate with the non-volatile memories.

EC13) A method comprising:
receiving data to program N portions of a plurality of non-volatile memories;
computing, based at least in part on the received data, redundancy information sufficient to recover from failures of M of the N portions;
requesting initial programming of the N portions in accordance with the received data; and
in response to identifying from one to M of the N portions that have failed the initial programming, requesting alternate programming of up to M alternate portions of the non-volatile memories in accordance with data calculated based at least in part on the redundancy information.

EC14) The method of EC13, wherein the data calculated is further based on at least in part on data read from ones of the N portions that accomplished the initial programming, and the data read corresponds to portions of the received data.

EC15) The method of EC13, further comprising requesting additional programming of M minus P portions of the non-volatile memories in accordance with all or any portions of the redundancy information.

EC16) The method of EC15, wherein P is zero.

EC17) The method of EC15, where P is one.

EC18) The method of EC13, wherein M is two and further comprising requesting additional programming of an additional portion of the non-volatile memories with a subset of the redundancy information sufficient to recover from a failure of one of the N portions.

EC19) The method of EC13, wherein the initial programming is at least in part via a first interface, and further comprising storing the redundancy information at least in part via a second interface that is separate from the first interface.

EC20) The method of EC19, wherein the first interface is an inter-chip interface and the second interface is an intra-chip interface.

EC21) The method of EC20, wherein the inter-chip interface is enabled to operate between a controller chip and one or more chips comprising the non-volatile memories.

EC22) The method of EC21, wherein the intra-chip interface is enabled to operate between control hardware of the controller chip and memory of the controller chip.

EC23) The method of EC13, further comprising storing the redundancy information at least until the identifying has completed.

EC24) The method of EC23, further comprising releasing, after calculating the calculated data, storage used by the storing.

EC25) The method of EC13, wherein the acts of the method are performed at least in part via a non-volatile memory controller that is operable as a solid-state disk controller enable to communicate with a computing host at least in part via a computing host interface compatible with a storage interface standard.

EC26) The method of EC25, wherein the non-volatile memory controller comprises a flash memory interface enabled to communicate with the non-volatile memories.

EC27) The method of EC1, EC9, or EC13, wherein each of the N portions comprises respective one or more pages of the non-volatile memories.

EC28) The method of EC1, EC9, or EC13, wherein each of the N portions comprises respective one or more blocks of the non-volatile memories.

EC29) The method of EC1, EC9, or EC13, wherein the non-volatile memories comprise one or more flash memories.

EC30) A system comprising:
an allocated buffer;
means for receiving at a non-volatile memory controller, data to program N portions of a plurality of non-volatile memories, the data comprising particular data to program a particular one of the N portions;
means for storing the particular data in the allocated buffer associated with the non-volatile memory controller;
means for beginning programming the particular data to a particular one of the non-volatile memories;
means for updating redundancy information sufficient to recover from failure of M of the N portions;
means for freeing the allocated buffer;
wherein at least one of the means for storing, the means for beginning programming the particular data, the means for updating redundancy information, and the means for freeing is responsive to the means for receiving; and
wherein the means for freeing is operable to free the allocated buffer prior to the particular non-volatile memory completing the programming.

EC31) The system of EC30, wherein the redundancy information is first redundancy information, data has been received for a subset of the N portions, programming has not yet begun for the subset of the N portions, and further comprising:
means for delaying programming of at least some of the subset of the N portions;
means for beginning programming the first redundancy information to ones of the non-volatile memories;
means for updating second redundancy information different from the first redundancy information and sufficient to recover from failures of M of the subset of the N portions; and
wherein at least one of the means for delaying programming, the means for beginning programming the first redundancy information, the means for beginning programming of the at least some of the subset of the N portions, and the means for updating second redundancy information is responsive to means for detecting a failure of the programming of the particular data.

EC32) The system of EC31, wherein the particular data is stored solely as encoded in the first redundancy information when the failure is detected.

EC33) The system of EC30, wherein the data further comprises initial data to program a first one of the N portions, and further comprising:
means for initializing the redundancy information based at least in part on the initial data.

EC34) The system of EC30, wherein the non-volatile memory controller comprises the allocated buffer.

EC35) The system of EC30, herein the allocated buffer is comprised in a first chip that is separate from a second chip that comprises the non-volatile memory controller.

EC36) The system of EC30, wherein the non-volatile memory controller is operable as solid-state disk controller enabled to communicate with a computing host at least in part via a computing host interface compatible with a storage interface standard.

EC37) The system of EC30, wherein the non-volatile memory controller comprises a flash memory interface enabled to communicate with the non-volatile memories.

EC38) A system comprising:
means for receding data to program N portions of a plurality of non-volatile memories;
means for requesting initial programming of the N portions in accordance with the received data, the initial programming completing on a first part of the N portions prior to the initial programming starting on a second part of the N portions;
responsive to the requesting initial programming, means for updating redundancy information sufficient to recover from failures of M of the ones of the N portions for which initial programming was requested; and
responsive to identifying from one to M of the first part of the N portions that have failed the initial programming, means for requesting alternate programming of up to M alternate portions of the non-volatile memories in accordance with data calculated based at least in part on the redundancy information.

EC39) The system of EC38, wherein the redundancy information is first redundancy information, and further comprising:
responsive to the identifying, and responsive to the means for requesting initial programming of each of the second part of the N portions, means for updating second redundancy information that is different from the first redundancy information.

EC40) The system of EC38, wherein the means of the system are comprised at least in part in a non-volatile memory controller that is operable as a solid-state disk controller enabled to communicate with a computing host at least in part via a computing host interface compatible with a storage interface standard.

EC41) The system of EC40, wherein the non-volatile memory controller comprises a flash memory interface enabled to communicate with the non-volatile memories.

EC42) A system comprising:
means for receiving data to program N portions of a plurality of non-volatile memories;
means for computing, based at least in part in the received date, redundancy information sufficient to recover from failure of M of the N portions;
means for requesting initial programming of the N portions in accordance with the received date; and
responsive to identifying from one to M of the N portions that have failed the initial programming, means for requesting alternate programming of up to M alternate portions of the non-volatile memories in accordance with data calculated based at least in part on the redundancy information.

EC43) The system of EC42, wherein the data calculated is further based at least in part on data read from ones of the N portions that accomplished the initial programming, and the data read corresponds to portions of the received date.

EC44) The system of EC42, further comprising means for requesting additional programming of M minus P portions of the non-volatile memories in accordance with all or any portions of the redundancy information.

EC45) The system of EC44, wherein P is zero.

EC46) The system of EC44, wherein P is one.

EC47) The system of EC42, wherein M is two and further comprising means for requesting additional programming if an additional portion of the non-volatile memories with a subset of the redundancy information sufficient to recover from a failure of one of the N portions.

EC48) The system of EC42, wherein the means for initial programming is operable at least in part via a first interface, and further comprising means for storing the redundancy information operable at least in part via a second interface that is separate from the first interface.

EC49) The system of EC48, wherein the first interface is an inter-chip interface and the second interface is an intra-chip interface.

EC50) The system of EC49, wherein the inter-chip interface is enabled to operate between a controller chip and one or more chips comprising the non-volatile memories.

EC51) The system of EC50, wherein the inter-chip interface is enabled to operate between control hardware of the controller chip and memory of the controller chip.

EC52) The system of EC42, further comprising means for storing the redundancy information at least until the identifying has completed.

EC53) The system of EC52, further comprising means for releasing, after calculating the calculated data, storage used by the means for storing.

EC54) The system of EC42, wherein the means of the system are comprised at least in part in a non-volatile memory controller that is operable as a solid-state disk controller enabled to communicate with a computing host at least in part via a computing host interface compatible with a storage interface standard.

EC55) The system of EC54, wherein the non-volatile memory controller comprises a flash memory interface enabled to communicate with the non-volatile memories.

EC56) The system of EC30, EC38, or EC42, wherein each of the N portions comprises respective one or more pages of the non-volatile memories.

EC57) The system of EC30, EC38, or EC42, wherein each of the N portions comprises respective one or more blocks of the non-volatile memories.

EC58) The system of EC30, EC38, or EC42, wherein the non-volatile memories comprise one or more flash memories.

EC59) A tangible computer readable medium having a set of instructions stored therein that when executed by a processing element cause the processing element to perform and/or control operations comprising:
receiving, at a non-volatile memory controller, data to program N portions of a plurality of non-volatile memories, the data comprising particular data to program a particular one of the N portions;
storing the particular data in an allocated buffer associated with the non-volatile memory controller;
beginning programming the particular data to a particular one of the non-volatile memories;
updating redundancy information sufficient to recover from failures of M of the N portions;
freeing the allocated buffer;
wherein at least one of the storing, the beginning programming the particular data, the updating redundancy information, and the freeing is in response to the receiving of the particular data; and wherein the freeing is prior to the particular non-volatile memory completing the programming.

EC60) The tangible computer readable medium of EC59, wherein the redundancy information is first redundancy information, data has been received for a subset of the N portions, programming has not yet begin for the subset of the N portions, and the operations further comprise:
- delaying programming of at least some of the subset of the N portions;
- beginning programming the first redundancy information to ones of the non-volatile memories;
- beginning programming of the at least some of the subset of the N portions;
- updating second redundancy information different from the first redundancy information and sufficient to recover from failures of M of the subset of the N portions; and
- wherein at least one of the delaying programming, the beginning programming the first redundancy information, the begging programming of the at least some of the subset of the N portions, and the updating second redundancy information is in response to detecting a failure of the programming of the particular data.

EC61) The tangible computer readable medium of EC60, wherein the particular data is stored solely as encoded in the first redundancy information when the failure is detected.

EC62) The tangible computer readable medium of EC59, wherein the data further comprises initial data to program a first one of the N portions, and the operations further comprise:
- initializing the redundancy information based at least in part in the initial data.

EC63) The tangible computer readable medium of EC59, wherein the non-volatile memory controller comprises the allocated buffer.

EC64) The tangible computer readable medium of EC59, wherein the allocated buffer is comprised in a first chip that is separate from a second chip that comprises the non-volatile memory controller.

EC65) The tangible computer readable medium of EC59, wherein the non-volatile memory controller is operable as a solid-state disk controller enabled to communicate with a computing host at least in part via a computing host interface compatible with a storage interface standard.

EC66) The tangible computer readable medium of EC59, wherein the non-volatile memory controller comprises a flash memory interface enabled to communicate with the non-volatile memories.

EC67) The tangible computer readable medium of EC59, wherein the non-volatile memory controller comprises the processing element.

EC68) A tangible computer readable medium having a set of instructions stored therein that when executed by a processing element cause the processing element to perform and/or control operations comprising:
- receiving data to program N portions of a plurality of non-volatile memories;
- requesting initial programming of the N portions in accordance with the received data, the initial programming completing on a first part of the N portions prior to the initial programming starting on a second part of the N portions;
- in response to the requesting initial programming, updating redundancy information sufficient to recover from failures of M of the ones of the N portions for which initial programming was requested; and
- in response to identifying from one to M of the first part f the N portions that have failed the initial programming, requesting alternate programming of up to M alternate portions of the non-volatile memories in accordance with data calculated based at least in part on the redundancy information.

EC69) The tangible computer readable medium of EC68, wherein the redundancy information is first redundancy information, and the operations further comprise:
- in response to the identifying, and in response to the requesting initial programming of each of the second part of the N portions, updating second redundancy information different from the first redundancy information.

EC70) The tangible computer readable medium of EC68, wherein the processing element is comprised in a non-volatile memory controller that is operable as a solid-state disk controller enabled to communicate with a computing host at least in part via a computing host interface compatible with a storage interface standard.

EC71) The tangible computer readable medium of EC70, wherein the non-volatile memory controller comprises a flash memory interface enabled to communicate with the non-volatile memories.

EC72) A tangible computer readable medium having a set of instructions stored therein that when executed by a processing element cause the processing element to perform and/or control operations comprising:
- receiving data to program N portions of a plurality of non-volatile memories;
- computing, based at least in part on the received data, redundancy information sufficient to recover from failures of M of the N portions;
- requesting initial programming of the N portions in accordance with the received data; and
- in response to identifying from one to M of the N portions that have failed the initial programming, requested alternate programming of up to M alternate portions of the non-volatile memories in accordance with data calculated based at least in part on the redundancy information.

EC73) The tangible computer readable medium of EC72, wherein the data calculated is further based at least in part on data read from ones of the N portions that accomplished the initial programming, and the data read corresponds to portions of the received data.

EC74) The tangible computer readable medium of EC72, wherein the operations further comprise requesting additional programming of M minus P portions of the non-volatile memories in accordance with all or any portions of the redundancy information.

EC75) The tangible computer readable medium of EC74, wherein P is zero.

EC76) The tangible computer readable medium of EC74, wherein P is one.

EC77) The tangible computer retable medium of EC72, wherein M is two and the operational further comprise requesting additional programming of an additional portion of the non-volatile memories with a subset of the redundancy information sufficient to recover from a failure of one of the N portions.

EC78) The tangible computer readable medium of EC72, herein the initial programming is at least in part via a first interface, and the operations further comprise storing the redundancy information at least in part via a second interface that is separate from the first interface.

EC79) The tangible computer readable medium of EC78, wherein the first interface is an inter-chip interface and the second interface is an intra-chip interface.

EC80) The tangible computer readable medium of EC79, wherein the inter-chip interface is enabled to operate between a controller chip and one or more chips comprising the non-volatile memories.

EC81) The tangible computer readable medium of EC80, wherein the intra-chip interface is enabled to operate between control hardware of the controller chip and memory of the controller chip.

EC82) The tangible computer readable medium of EC72, wherein the operations further comprise storing the redundancy information at least until the identifying has completed.

EC83) The tangible computer readable medium of EC82, wherein the operations further comprise releasing, after calculating the calculated data, storage used by the storing.

EC84) The tangible computer readable medium of EC72, wherein the processing element is comprised in a non-volatile memory controller that is operable as a solid-state disk controller enabled to communicate with a computing host at least in part via a computing host interface compatible with a storage interface standard.

EC85) The tangible computer readable medium of EC84, wherein the non-volatile memory controller comprises a flash memory interface enabled to communicate with the non-volatile memories.

EC86) The tangible computer readable medium of EC59, EC68, EC72, wherein each of the N portions comprises respective one or more pages of the non-volatile memories.

EC87) The tangible computer readable medium of EC59, EC68, or EC72, wherein each of the N portions comprises respective one or more blocks of the non-volatile memories.

EC88) The tangible computer readable medium of EC59, EC68, or EC72, wherein the non-volatile memories comprise one or more flash memories.

EC89) Any of the foregoing ECs having or referring to a storage interface standard, wherein the storage interface standard comprises one or more of
   a Universal Serial Bus (USB) interface standard,
   a Compact Flash (CF) interface standard,
   a MultiMediaCard (MMC) interface standard,
   an embedded MMC (eMMC) interface standard,
   A Thunderbolt interface standard,
   a UFS interface standard,
   a Secure Digital (SD) interface standard,
   a Memory Stick interface standard,
   an xD-picture card interface standard,
   a Serial Advanced Technology Attachment (SATA) interface standard,
   an external SATA (eSATA) interface standard,
   a Small Computer System Interface (SCSI) interface standard,
   a Serial Attached Small Computer System Interface (SAS) interface standard,
   a Fibre Channel interface standard,
   an Ethernet interface standard, and
   a Peripheral Component Interconnect express (PCIe) interface standard.

EC90) Any of the foregoing ECs having or referring to a flash memory interface, wherein the flash memory interface is compatible with one or more of
   an Open NAND Flash Interface (ONFI),
   a Toggle-mode interface,
   a Double-Data-Rate (DDR) synchronous interface,
   a DDR2 synchronous interface;
   a synchronous interface, and
   an asynchronous interface.

EC91) Any of the foregoing ECs having or referring to a computing host, wherein the computing host comprises one or more of
   a computer,
   a workstation computer,
   a server computer,
   a storage server,
   a Storage Attached Network (SAN),
   a Network Attached Storage (NAS) device,
   a Direct Attached Storage (DAS) device,
   a storage appliance,
   a Personal Computer (PC),
   a laptop computer,
   a notebook computer,
   a netbook computer,
   a tablet device or computer,
   an ultrabook computer,
   an electronic reading device (an e-reader),
   a Personal Digital Assistant (PDA),
   a navigation system,
   a (handheld) Global Positioning System (GPS) device,
   an automotive control system,
   an automobile media control system or computer,
   a printer, copier or fax machine or all-in-one device,
   a Point Of Sale POS device,
   a cash-register,
   a media player,
   a television,
   a media recorder,
   a Digital Video Recorder (DVR),
   a digital camera,
   a cellular handset,
   a cordless telephone handset, and
   an electronic game.

EC92) Any of the foregoing ECs having or referring to at least one flash memory, wherein at least a portion of the at least one flash memory comprises one or more of
   NAND flash technology storage cells, and
   NOR flash technology storage cells.

EC93) Any of the foregoing ECs having or referring to at least one flash memory, wherein at least a portion of the at least one flash memory comprises one or more of
   Single-Level Cell (SLC) flash technology storage cells, and
   Multi-Level Cell (MLC) flash technology storage cells.

EC94) Any of the foregoing ECs having or referring to at least one flash memory, wherein at least a portion of the at least one flash memory comprises one or more of
   polysilicon technology-based charge storage cells, and
   silicon nitride technology-based change storage cells.

EC95) Any of the foregoing ECs having or referring to at least one flash memory, wherein at least a portion of the at least one flash memory comprises one or more of
   two-dimensional technology-based flash memory technology, and
   three-dimensional technology-based flash memory technology.

System

In some embodiments, an I/O device, such as an SSD, includes an SSD controller. The SSD controller acts as a bridge between the host interface and NVM of the SSD, and executes commands of a host protocol sent from a computing host via a host interface of the SSD. At least some of the commands direct the SSD to write and read the NVM with data sent from and to the computing host, respectively. In further embodiments, the SSD controller is enabled to use a map to translate between LBAs of the host protocol and physical storage addresses in the NVM. In further embodiments, at least a portion of the map is used for private storage (not visible to the computing host) of the I/O device. For example, a portion of the LBAs not accessible by the computing host is used by the I/O device to manage access to logs, statistics, or other private data.

In some embodiments, accessing compressed data of varying-sized quanta in NVM provides improved storage efficient in some usage scenarios. For example, an SSD controller receives (uncompressed) data from a computing host (e.g., relating to a disk write command), compresses the data, and stores the compressed data into flash memory. In response to a subsequent request from the computing host (e.g., relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host. In the instant application, uncompress (and variants thereof) is synonymous with decompress (and variants thereof).

In various embodiments, an SSD controller includes a host interface for interface with a computing host, an interface for interfacing with NVM such as flash memory, and circuitry for controlling the interfaces and performing (and/or controlling various aspects of the performing) compressing and uncompressing, as well as lower-level redundancy and/or error correction, higher-level redundancy and/or error correction, and dynamic higher-level redundancy mode management with independent silicon elements.

According to various embodiments, some host interfaces are compatible with one or more of a USB interface standard, a CF interface standard, an MMC interface standard, an eMMC interface standard, a Thunderbolt interface standard, a UFS interface standard, an SD interface standard, a Memory Stick interface standard, an xD-picture card interface standard, an IDE interface standard, a SATA interface standard, a SCSI interface standard, a SAS interface standard, and a PCIe interface standard. According to various embodiments, the computing host is all of any portions of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game. In some embodiments, an interfacing host (such as a SAS/SATA bridge) operates as a computing host and/or as a bridge to a computing host.

In various embodiments, the SSD controller includes one or more processors. The processors execute firmware to control and/or perform operation of the SSD controller. The SSD controller communicates with the computing host to send and receive commands and/or status as well as data. The computing host executes one or more of an operating system, a driver, and an application. Communication by the computing host with the SSD controller is optionally and/or selectively via the driver and/or via the application. In a first example, all communication to the SSD controller is via the driver, and the application provides higher-level commands to the driver that the driver translates into specific commands for the SSD controller. In a second example, the driver implements a bypass mode and the application is enabled to send specific commands to the SSD controller via the driver. In a third example a PCIe-SSD controller supports one or more Virtual Functions (VFs), enabling an application, once configured, to communicate directly with the SSD controller, bypassing the driver.

According to various embodiments, some SSDs are compatible with form-factors, electrical interfaces, and/or protocols used by magnetic and/or optical non-volatile storage, such as HDDs, CD drives, and DVD drives. In various embodiments, SSDs use various combinations of zero or more parity codes, zero or more RS codes, zero or more BCH codes, zero or more Viterbi or other trellis codes, and zero or more LDPC codes.

FIG. 1A illustrates selected details of an embodiment of a Solid-State Disk (SSD) including an SSD controller providing program failure recovery for Non-Volatile Memories (NVMs) via one or more (optionally internal) redundant arrays. The SSD controller is for managing non-volatile storage, such as implemented via NVM elements (e.g., flash memories). SSD Controller 100 is communicatively coupled via one or more External Interfaces 110 to a host (not illustrated). According to various embodiments, External Interfaces 110 are one or more of: a SATA interface; a SAS interface; a PCIe interface; a Fibre Channel interface; an Ethernet Interface (such as 10 Gigabit Ethernet); a non-standard version of any of the preceding interfaces; a customer interface; or any other type of interface used to interconnect storage and/or communications and/or computing devices. For example, in some embodiments, SSD Controller 100 includes a SATA interface and a PCIe interface.

SSD Controller 100 is further communicatively coupled via one or more Device Interfaces 190 to NVM 199 including one or more storage devices, such as one or more instances of Flash Device 192. According to various embodiments, Devices Interfaces 190 are one or more of: an asynchronous interface; a synchronous interface, a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a customer interface; or any other type of interface used to connect to storage devices.

Each of Flash Device 192 has, in some embodiments, one or more individual Flash Die 194. According to type of a particular one of Flash Device 192, a plurality of Flash Die 194 in the particular Flash Device 192 is optionally and/or selectively accessible in parallel. Flash device 12 is merely representative of one type of storage device enabled to communicatively couple to SSD Controller 100. In various embodiments, any type of storage device is usable, such as an SLC NAND flash memory, MLC NAND flash memory, NOR flash memory, flash memory using polysilicon or silicon nitride technology-based charge storage cells, twoor three-dimensional technology-based flash memory, read-only memory, static random access memory, dynamic random access memory, ferromagnetic memory, phase-change memory, racetrack memory, ReRAM, or any other type of memory device or storage medium.

According to various embodiments, Device Interfaces 190 are organized as: one or more busses with one or more instances of Flash Device 192 per bus; one or more groups of busses with one or more instances of Flash Device 192 per bus, having busses in a group generally accessed in parallel; or any other organization of one or more instances of Flash Device 192 onto Device Interfaces 190.

Continuing in FIG. 1A, SSD Controller 100 has one or more modules, such as Host Interfaces 111, Data Processing 121, Buffer 131, Map 141, Recycler 151, ECC 161, Device Interface Logic 191, and CPU 171. The specific modules and interconnections illustrated in FIG. 1A are merely representative of one embodiment, and many arrangements and interconnections of some or all of the modules, as well as additional modules not illustrated, are conceived. In a first example, in some embodiments, there are two or more Host Interfaces 111 to provide dual-porting. In a second example, in some embodiments, Data Processing 121 and/or ECC 161 are combined with Buffer 131. In a third example, in some embodiments, Host Interfaces 111 is directly coupled to Buffer 131, and Data Processing 121 optionally and/or selectively operates on data stored in Buffer 131. In a fourth example, in some embodiments, Device Interface Logic 191 is directly coupled to Buffer 131, and ECC 161 optionally and/or selectively operates on data stored in Buffer 131.

Host Interfaces 111 sends and receives commands and/or data via External Interfaces 110, and, in some embodiments, tracks progress of individual commands via Tag Tracking 113. For example, the command include a read command specifying an address (such as an LBA) and an amount of data (such as a number of LBA quanta, e.g., sectors) to read; in response the SSD provided read status and/or read data. For another example, the commands include a write command specifying an address (such as an LBA) and an amount of data (such as a number of LBA quanta, e.g., sectors) to write; in response the SSD provided write status and/or requests write data and optionally subsequently provided write status. For yet another example, the commands include a de-allocation command (e.g. a trim command) specifying one or more address (such as one or more LBAs) that no longer need be allocated; in response the SSD modifies the Map accordingly and optionally provide de-allocation status. In some contexts an ATA compatible TRIM command is an exemplary de-allocation command. For yet another example, the commands include a super capacitor test command or a data hardening success query; in response, the SSD provided appropriate status. In some embodiments, Host Interfaces 111 is compatible with a SATA protocol and, using NCQ commands, is enabled to have up to 32 pending commands, each with a unique tag represented as a number from 0 to 31. In some embodiments, Tag Tracking 113 is enabled to associate an external tag for a command received via External Interfaces 110 with an internal tag used to track the command during processing by SSD Controller 100.

According to various embodiments, one or more of: Data Processing 121 optionally and/or selectively processes some or all data sent between Buffer 131 and External Interfaces 110; and Data Processing 121 optionally and/or selectively processes data stored in Buffer 131. In some embodiments, Data Processing 121 uses one or more Engines 123 to perform one or more of: formatting; reformatting; transcoding; and any other data processing and/or manipulation task.

Buffer 131 stores data sent to/from External Interfaces 110 from/to device Interfaces 190. In some embodiments, Buffer 131 additionally stores system data, such as some or all map tables, used by SSD Controller 100 to manage one or more instances of Flash device 192. In various embodiments, Buffer 131 has one or more of: Memory 137 used for temporary storage of data; Allocated Buffer 138 used for storage related to NVM writing/programming (described elsewhere herein), DMA 133 used to control movement of data to and/or from Buffer 131; and ECC-X 135 used to provide higher-level error correction and/or redundancy functions; and other data movement and/or manipulation functions. An example of a higher-level redundancy function is a RAID-like capability (e.g. RASIE, such as described in further detail elsewhere herein); with redundancy at a flash device level; (e.g., multiple ones of Flash Device 192) and/or a flash die level (e.g., Flash Die 194) instead of at a disk level.

According to various embodiments, one or more of: ECC 161 optionally and/or selectively processes some or all data sent between Buffer 131 and Device Interfaces 190; and ECC 161 optionally and/or selectively processes data stored in Buffer 131. In some embodiments, ECC 166 is used to provide lower-level error correction and/or redundancy functions, such as in accordance with one or more ECC techniques. In some embodiments, ECC 161 implements one or more of: a CRC code; a Hamming code; an RD code; a BCH code; and LDPC code; a Viterbi code; a trellis code; a hard-decision code; a soft-decision code; an erasure-based code; any error detecting and/or correcting code; and any combination of the preceding. In some embodiments, ECC 161 includes one or more decoders (such as LDPC decoders).

Device Interface Logic 191 controls instances of Flash Device 192 via Device Interfaces 190. Device Interface Logic 191 is enabled to send data to/from the instances of Flash device 192 according to a protocol of Flash device 192. Device Interface Logic 191 includes Scheduling 193 to selectively sequence control of the instances of Flash Device 192 via device Interfaces 190. For example, in some embodiments, Scheduling 193 is enabled to queue operations to the instances of Flash Device 192, and to selectively send the operations to individual ones of the instances of Flash Device 192 (or Flash Die 194) as individual ones of the instances of Flash Device 192 (or Flash Die 194) are available.

Map 141 converts between data addressing used on External Interfaces 110 and data addressing used on Device Interfaces 190, using Table 143 to map external data addresses to locations in NVM 199. For example, in some embodiments, Map 141 converts LBAs used on External Interfaces 110 to block and/or page addresses targeting one or more Flash Die 194, via mapping provided by Table 143. For LBAs that have never been written since drive manufacture or de-allocations, the Map points to a default value to return if the LBAs are read. For example, when processing a de-allocation command, the Map is modified so that entries corresponding to the de-allocated LBAs point to one of the default values. In various embodiments, there are various default values, each having a corresponding pointer. The plurality of default values enables reading some de-allocated LBAs (such as in a first range) as one default value, while reading other de-allocated LBAs (such as in a second range) as another default value. The default values, in various embodiments, are defined by flash memory, hardware, firmware, command and/or primitive arguments and/or parameters, programmable registers, or various combinations thereof.

In some embodiments, Map 141 uses Table 143 to perform and/or to look up translations between addresses used on External Interfaces 110 and data addressing used on Device Interfaces 190. According to various embodiments, Table 143 is one or more: a one-level map; a two-level map; a multi-level map; a map cache; a compressed map; any type of mapping from one address space to another; and any combination of the foregoing. According to various embodiments, Table 143 includes one or more of: static random access memory; dynamic random access memory; NVM (such as flash memory); cache memory; on-chip memory; off-chip memory; and any combination of the foregoing.

In some embodiments, Recycler 151 performs garbage collection. For example, in some embodiments, instances of Flash Device 192 contain blocks that must be erased before the blocks are re-writable. Recycler 151 is enabled to determine which portions of the instances of Flash device 192 are actively in use (e.g., allocated instead of de-allocated), such as by scanning a map maintained by Map 141, and to make unused (e.g., de-allocation) portions of the instances of Flash Device 192 available for writing by erasing the unused portions. In further embodiments, Recycler 151 is enabled to move data stored within instances of Flash Device 192 to make larger contiguous portions of the instances of Flash device 192 available for writing.

In some embodiments, instances of Flash device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from Recycler 151 is written into a cold (less active) band. In some usage scenarios, if the computing host writes a long, sequential stream, than a size of the hot band grows, whereas if the computing host does random writes or few writes, then a size of the cold band grows.

CPU 171 controls various portions of SSD Controller 100. CPU 171 includes CPU Core 172. CPU Core 172 is, according to various embodiments, one or more single-core or multi-core processors. The individual processors cores in CPU Core 172 are, in some embodiments, multi-threaded. CPU Core 172 include instructions and/or data caches and/or memories. For example, the instruction memory contains instructions to enable CPU Core 172 to execute programs (e.g. software sometimes called firmware) to control SSD Controller 100. In some embodiments, some or all of the firmware executed by CPU Core 172 is stored on instances of Flash device 192 (as illustrated, e.g., as Firmware 106 of NVM 199 in FIG. 1B).

In various embodiments, CPU 171 further includes: Command Management 173 to track and control commands received via External Interfaces 110 while the commands are in progress; Buffer Management 175 to control allocation and use of Buffer 131; Translation Management 177 to control Map 141; Coherency Management 179 to control consistency of data addressing and to avoid conflicts such as between external data accesses and recycle data accesses; Device Management 181 to control Device Interface Logic 191; Identify Management 182 to control modification and communication of identify information, and optionally other management units. None, any, or all of the management functions performed by CPU 171 are, according to various embodiments, controlled and/or managed by hardware, by software (such as firmware executing on CPU Core 172 or on a host connected via External Interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD Controller 100 and is compatible with operation with various computing hosts, such as via adaptation of Host Interfaces 111 and/or External Interfaces 110. The various computing hosts include one or any combination of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game.

In various embodiments, all or any portions of an SSD controller (or a computing-host flash memory controller) are implemented on a single IC, a single die of a multi-die IC, a plurality of dice of a multi-die IC, or a plurality of ICs. For example, Buffer 131 is implemented on a same die as other elements of SSD Controller 100. For another example, Buffer 131 is implemented on a different die than other elements of SSD Controller 100.

Figure 1B:
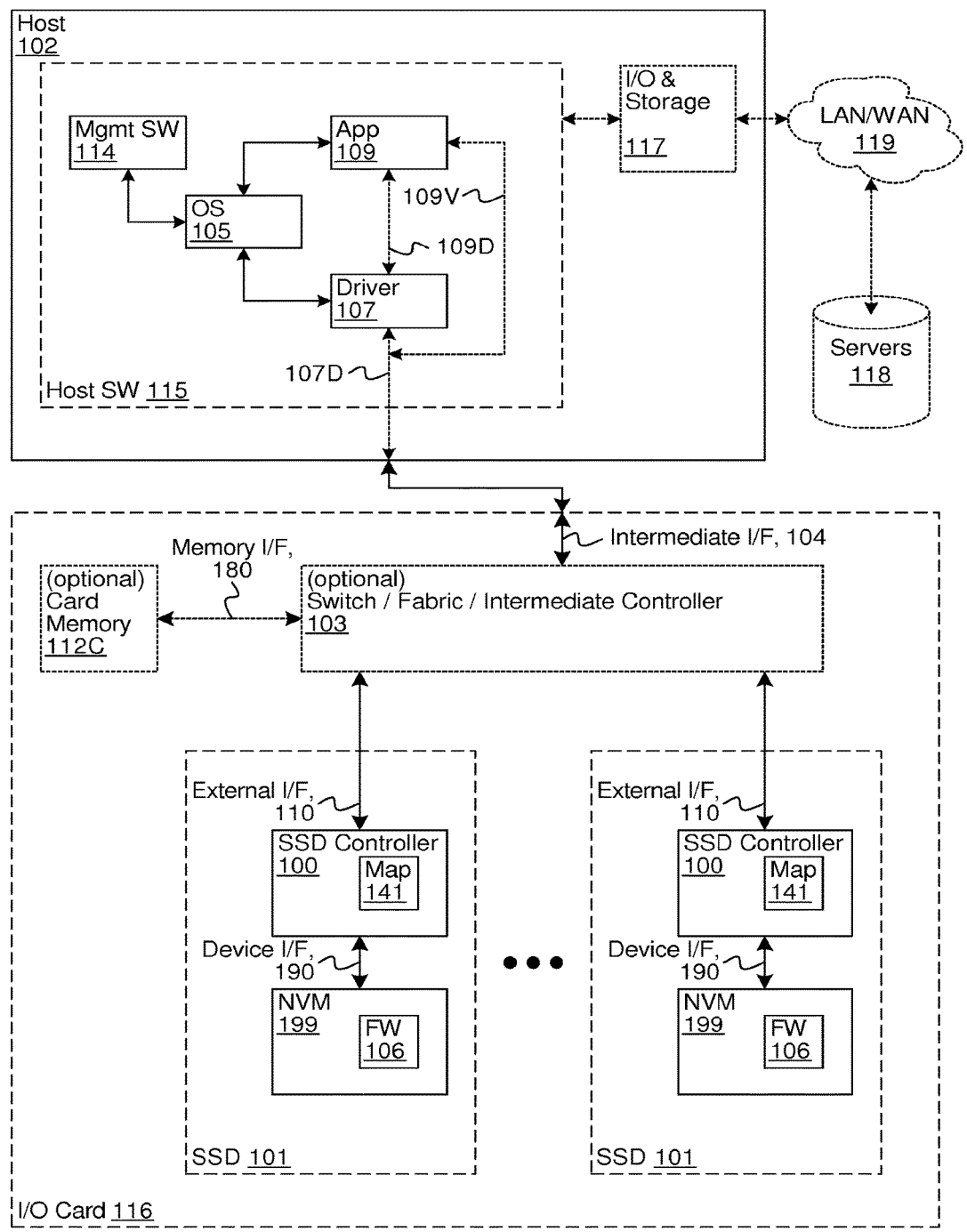
FIG. 1B illustrates selected details of various embodiments of systems including one or more instances of the SSD of FIG. 1A.

FIG. 1B illustrates selected details of various embodiments of systems including one or more instances of the SSD of FIG. 1A. SSD 101 includes SSD Controller 100 coupled to NVM 199 via Device Interfaces 190. The figure illustrates various classes of embodiments: a single SSD coupled directly to a host, a plurality of SSDs each respectively coupled directly to a host via respective external interfaces, and one or more SSDs coupled indirectly to a host via various interconnection elements.

As an example embodiment of a single SSD coupled directly to a host, one instance of SSD 1901 is coupled directly to Host 102 via External Interfaces 110 (e.g. Switch/Fabric/Intermediate Controller 103 is omitted, bypassed, or passed-through). As an example embodiment of a plurality of SSDs each coupled directly to a host via respective external interfaces, each of a plurality of instances of SSD 101 is respectively coupled directly to Host 102 via a respective instance of External Interfaces 110 (e.g. Switch/Fabric/Intermediate Controller 103 is omitted, bypassed, or passed-through). As an example embodiment of one or more SSDs coupled indirectly to a host via various interconnection elements, each of one or more instances of SSD 101 is respectively coupled indirectly to host 102. Each indirect coupling is via a respective instance of External Interfaces 110 coupled to Switch/Fabric/Intermediate Controller 103, and Intermediate Interfaces 104 coupling to Host 102.

Some of the embodiments including Switch/Fabric/Intermediate Controller 103 also include Card Memory 112C coupled via Memory Interface 180 and accessible by the SSDs. In various embodiments, one or more of the SSDs, the Switch/Fabric/Intermediate Controller, and/or the Card Memory are included on a physically identifiable module, card, or pluggable element (e.g. I/O Card 116). In some embodiments, SSD 101 (or variation thereof) corresponds to a SAS drive or a SATA drive that is coupled to an initiator operating as Host 102.

Host 102 is enabled to execute various elements of Host Software 115, such as various combinations of OS 105, Driver 107, Application 109, and Multi-Device Management Software 114. Dotted-arrow 107D is representative of Host Software↔I/O Device Communication, e.g. data sent-received to/from one or more of the instances of SSD 101 and from/to any one or more of OS 105 via Driver 107, Driver 107, and Application 109, either via Driver 107, or directly as a VF.

OS 105 includes and/or is enabled to operate with drivers (illustrated conceptually by Driver 107) for interfacing with the SSD. Various versions of Windows (e.g. 95, 98, ME, NT, XP, 2000, Server, Vista, and 7), various versions of Linux (e.g. Red Hat, Debian, and Ubonm), and various versions of MacOS (e.g. 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101. Some drives and/or drivers have pass-through modes to enable application-level programs, such as Application 109 via Optimized NAND Access (sometimes termed ONA) or Direct NAND Access (sometimes termed DNA) techniques, to communicate commands directly to SSD 101, enabling a customized application to use commands specific to SSD 101 even with a generic driver. ONA techniques include one or more of: use of non-standard modifies (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level program are an application without ONA or DNA support, an ONA-enabled application, a DNA-enabled application, and an ONA/DNA-enabled application. Dotted-arrow 109D is representative of Application↔I/O Device Communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of Application↔I/O Device Communication (e.g. bypass via a VF for an application), e.g.: a DNA-enabled application and a DNA-enabled driver communicating with an SSD, such as without the application using the OS or the driver as intermediaries.

One or more portions of NVM 199 are used, in some embodiments, for firmware storage, e.g. Firmware 106. The firmware storage includes one or more firmware images (or portions thereof). A firmware image has, for example, one or more images of firmware, executed, e.g., by CPU Core 172 of SSD Controller 109. A firmware image has, for another example, one or more images of constants, parameter values, and NVM device information, referenced, e.g. to a current firmware image and zero or more previous (with respect to firmware updates) firmware images. In various embodiments, the firmware provides for generic, standard, ONA, and/or DNA operating modes. In some embodiments, one or more of the firmware operating modes are enabled (e.g. one or more APIs are "unlocked") via keys or various software techniques, optionally communicated and/or provided by a driver.

In some embodiments lacking the Switch/Fabric/Intermediate Controller, the SSD is coupled to the Host directly via External Interfaces 110. In various embodiments, SSD Controller 100 is coupled to the Host via one or more intermediate levels of other controllers, such as a RAID controller. In some embodiments, SSD 101 (or variations thereof) corresponds to a SAS drive or a SATA drive and Switch/Fabric/Intermediate Controller 103 corresponds to an expander that is in turn coupled to an initiator, or alternatively Switch/Fabric/Intermediate Controller 103 corresponds to a bridge that is indirectly coupled to an initiator via an expander. In some embodiments, Switch/Fabric/Intermediate Controller 103 includes one or more PCIe switches and/or fabrics.

In various embodiments, such as some of the embodiments with Host 102 as a computing host (e.g. a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g. via optional I/O & Storage device/Resources 117 and optional LAN/WAN 119) with one pr more local and/or remote servers (e.g. optional Servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UPS storage component, an SD storage component, a Memory Stick storage component, and xD-picture card storage component.

In various embodiments, all or any portions of an SSD controller (or a computing-host flash memory controller), or functions thereof, are implemented in a host that the controller is to be coupled with (e.g. Host 102 of FIG. 1B). In various embodiments, all or any portions of an SSD controller (or a computing-host flash memory controller), or functions thereof, are implemented via hardware (e.g., logic circuitry), software and/or firmware (e.g., driver software and/or SSD control firmware), or any combinations thereof. For example, functionality of or associated with an ECC unit (such as similar to ECC 161 and/or ECC-X 135 of FIG. 1A) is implemented partially via software on a host and partially via a combination of firmware and hardware in an SSD controller. For another example, functionality of or associated with a recycler unit (such as similar to recycler 151 of FIG. 1A) is implemented partially via software on a host and partially via hardware in a computing-host flash memory controller.

Mapping Operation

Figure 2:
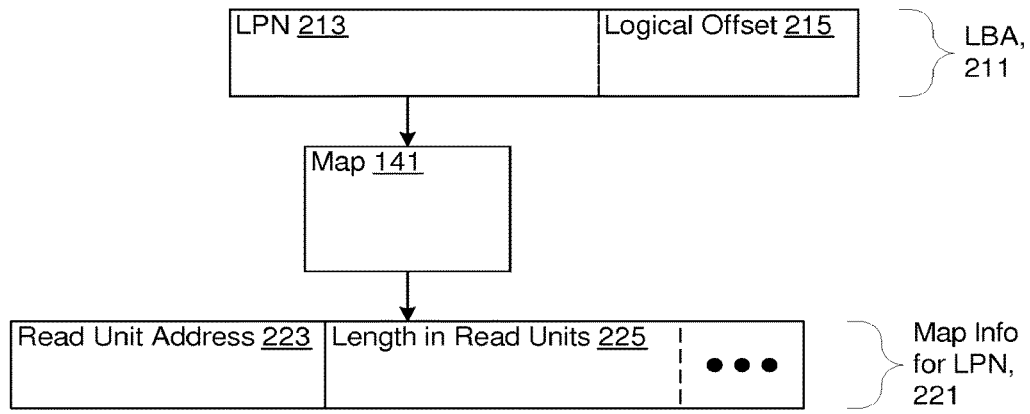
FIG. 2 illustrates selected details of an embodiment of mapping a Logical Page Number (LPN) portion of a Logical Block Address (LBA).

FIG. 2 illustrates details of an embodiment of mapping an LPN portion of an LBA. In some embodiments, a read unit is a finest granularity of an NVM that is independently readable, such as a portion of a page of the NVM. In further embodiments, the read unit corresponds to check bits (sometimes-termed redundancy) of a (lower-level) error-correcting code along with all data protected via the check bits. For example, ECC 161 of FIG. 1A implements error correction via check bits such as via an LDPC code, and a read unit corresponds to coding bits implementing the LDPC code in addition to data bits protected by the LDPC coding bits.

In some embodiments, Map 141 maps LPN 213 portion of LBA 211 to Map Info for LPN 221, such as via Table 143 (as illustrated in FIG. 1A). Map info for an LPN (such as Map Info for LPN 221) is sometimes termed a map entry. Map 141 is said to associate an LPN with a corresponding map entry. In various embodiments, mapping is via once or more associative look-ups, via one or more non-associative look-ups, and/or via one or more other techniques.

In some embodiments, SSD Controller 100 maintains one map entry for each LPN potentially and/or actively in use.

In some embodiments, Map Info for LPN 221 includes respectively Read Unit Address 223 and Length in Read Units 225. In some embodiments, a length and/or a span are stored encoded, such as by storing the length as an offset from the span, e.g. in all or any portions of Length in Read Units 225. In further embodiments, a first LPN is associated with a first map entry, a second LPN (different from the first LPN, but referring to a logical page of a same size as a logical page referred to by the first LPN) is associated with a second map entry, and the respective length in read units of the first map entry is different from the respective length in read units of the second map entry.

In various embodiments, at a same point in time, a first LPN is associated with a first map entry, a second LPN (different from the first LPN) is associated with a second map entry, and the respective read unit address of the first map entry is the same as the respective read unit address of the second map entry. In further embodiments, data associated with the first LPN and data associated with the second LPN are both stored in a same physical page of a same device in NVM 199.

According to various embodiments, Read Unit Address 223 is associated with one or more of: a starting address in the NVM; an ending address in the NVM; an offset of any of the preceding; and any other techniques for identifying a portion of the NVM associated with LPN 213.

Figure 3:
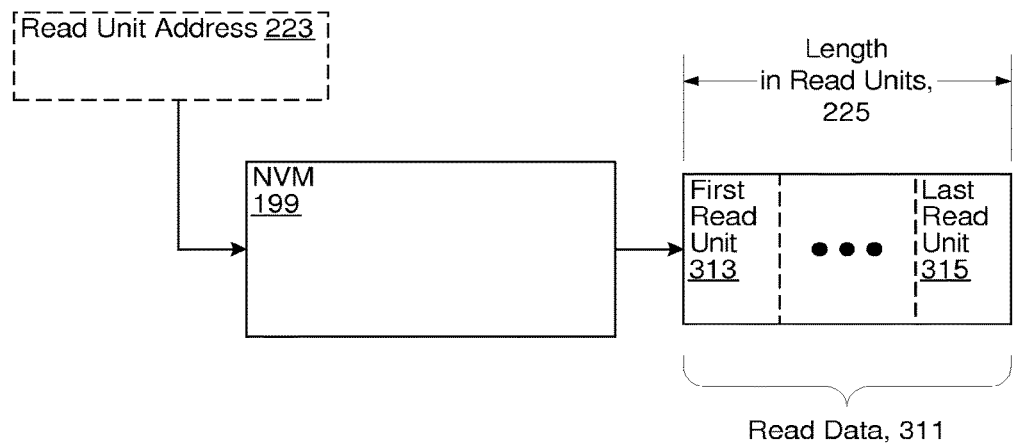
FIG. 3 illustrates selected details of an embodiment of accessing a Non-Volatile Memory (NVM) at a read unit address to produce read data organized as various read units, collectively having a length measured in quanta of read units.

FIG. 3 illustrates selected details of an embodiment of accessing an NVM at a read unit address to produce read data organized as various units, collectively having a length measured in quanta of read units. According to various embodiments, First Read Unit 313 is one or more of: a one of read units in Read Data 311 with a lowest address in an address space of the NVM; a fixed one of the read units; an arbitrary one of the read units; a variable one of the read units; and a one of the read units selected by any other technique. In various embodiments, SSD Controller 100 if enabled to access NVM 199 and produce Read Data 311 by reading no more than a number of read units specified by Length in Read Units 225.

Figure 4A:
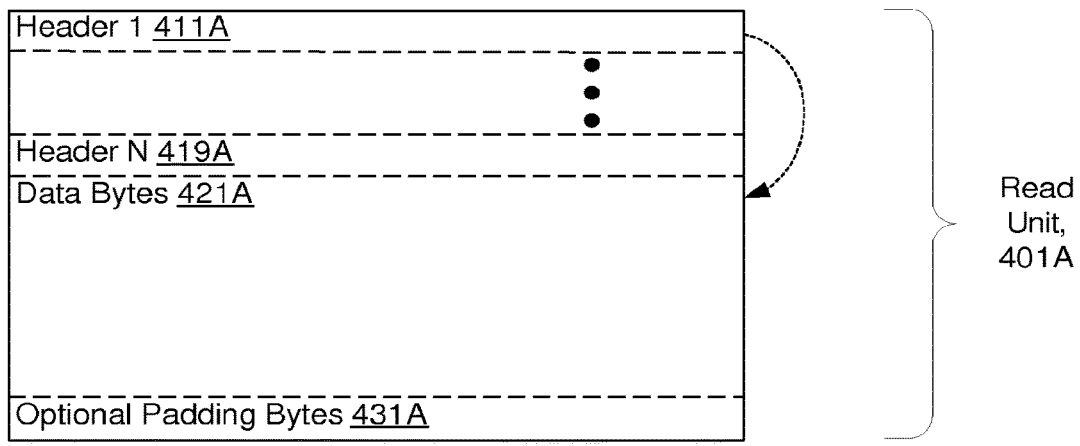
FIG. 4A illustrates selected details of an embodiment of a read unit.

FIG. 4A illustrates selected details of an embodiment of a read unit (such as Read Units 313 or 315 of FIG. 3) as Read Unit 401A. In various embodiments and/or usage scenarios, Header 1 411A through Header N 419A are contiguous, and respective data regions identified (such as via respective offsets) by each of the headers are contiguous following a last one of the headers. The data regions collectively form Data Bytes 421A. The data regions are stored in a location order that matches the location order the headers are stored. For example, consider a first header, at the beginning of a read unit, with a second header and a third header contiguously following the first header. A first data region (identified by a first offset in the first header) contiguously follows the third header. A second data region (identified by a second offset in the second header) contiguously follows the first data region. Similarly, a third data region (identified by the third header) contiguously follows the second data region.

Figure 4B:
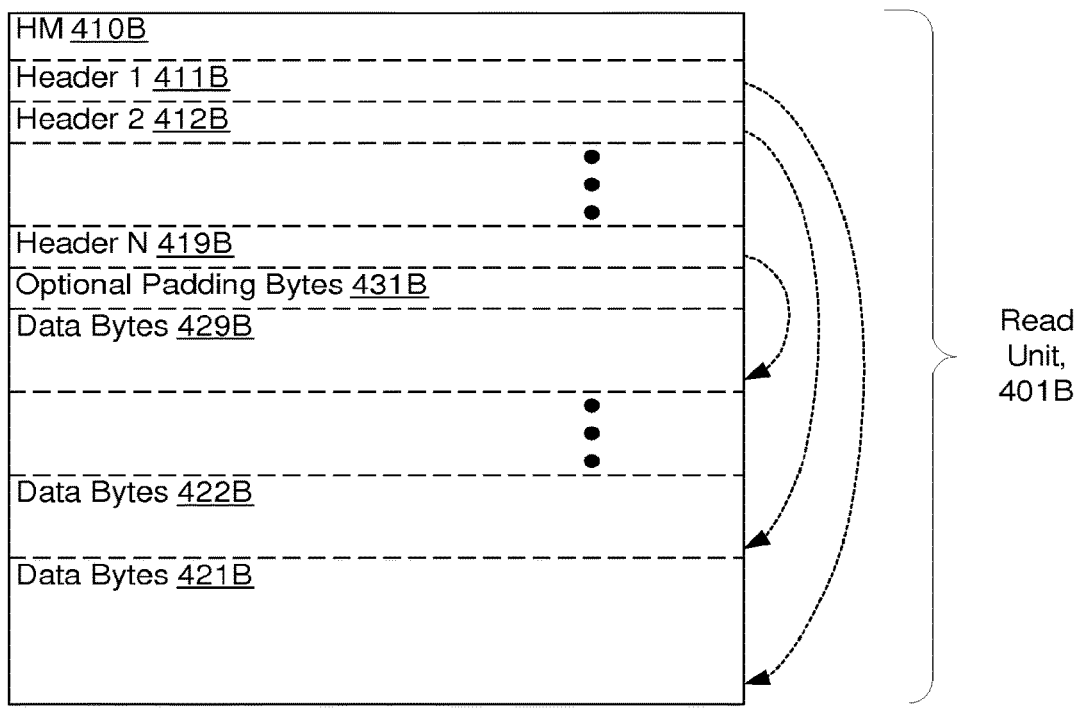
FIG. 4B illustrates selected details of another embodiment of a read unit.

FIG. 4B illustrates selected details of another embodiment of a read unit (such as read Units 313 or 315 of FIG. 3) as Read Unit 401B. In various embodiments and/or usage scenarios, Header Marker (HM) 410B is an optional initial field (such as a one-byte field) indicating a number of following contiguous headers (Header 1 411B, Header 2 412B . . . Header N 419B). Data regions (Data Bytes 421B, Data Bytes 422B . . . Data Bytes 429B) are identified respectively by the headers (Header 1 411B, Header 2 412B . . . Header N 419B) and are stored in a location order that is opposite of the location order that the headers are stored. Headers start at the beginning of a read unit, while corresponding data regions start at the end of read unit. In some embodiments, data bytes within a data region (e.g. Data Bytes 421B, Data Bytes 422B . . . Data Bytes 429B) are arranged in a forward order (byte order matching location order), while in other embodiments, the data bytes are arranged in a reverse order (byte order reversed with respect to location order). In some embodiments, a header marker is used in read units where headers and data bytes are stored in a same location order (e.g. as illustrated in FIG. 4A).

In some embodiments, Optional Padding Bytes 431A (or 431B) are according to granularity of data associated with a particular LPN. For example, in some embodiments, if Data Bytes 421A (or collectively Data Bytes 421B, Data Bytes 422B . . . Data Bytes 429B) have less than a fixed amount of remaining space, such as 8 bytes, after storing data associated with all but a last one of Header 1 411A through Header N 419A (or Header 1 411B, Header 2 412B . . . Header N 419B), then data for an LPN associated with the last header starts in a subsequent read unit. In further embodiments, a particular offset value (e.g. all ones) in the last header indicates that the data for the LPN associated with the last header starts in the subsequent read unit.

Figure 5:
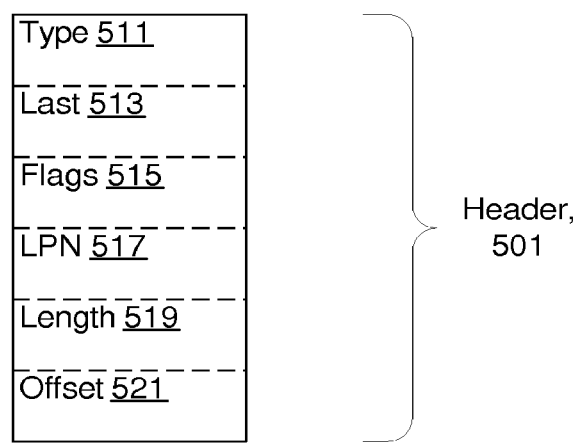
FIG. 5 illustrates selected details of an embodiment of a header having a number of fields.

FIG. 5 illustrates selected details of an embodiment of a header (such as any of Header 1 411A through Header N 419A of FIG. 4A or Header 1 411B through Header 419B of FIG. 4B) having a number of fields. In some embodiments, headers are fixed-length (e.g. each header is a same number of bytes long). Header 501 includes fields Type 511, Last Indicator 513, Flags 515, LPN 517, Length 519, and Offset 521. The type field identifies a category of the data bytes. For example, the type file indicates the category of the data bytes is one of host data (e.g. logical page data) or system data (e.g. map information or checkpoint information). The last field indicates that the header is the last header before the data bytes. In some embodiments with a header marker, the last field is optionally omitted. The LPN field is the LPN that the header is associated with. The LPN field enables parsing of the headers to determine a particular one of the headers that is associated with a particular LPN by, for example, searching the headers for one with an LPN field matching the particular LPN. The length field is the length, in bytes, of the data bytes (e.g. how many bytes of data there are in Data Bytes 421A associated with header 501). In some embodiments, an offset in the offset field is rounded according to a particular granularity (e.g. 8-byte granularity).

In various embodiments, some or all information associated with a particular LPN is stored in a map entry associated with the particular LPN, a header associated with the particular LPN, or both. For example, in some embodiments, some or all of Length 519 is stored in a map entry rather than in a header.

Figure 6:
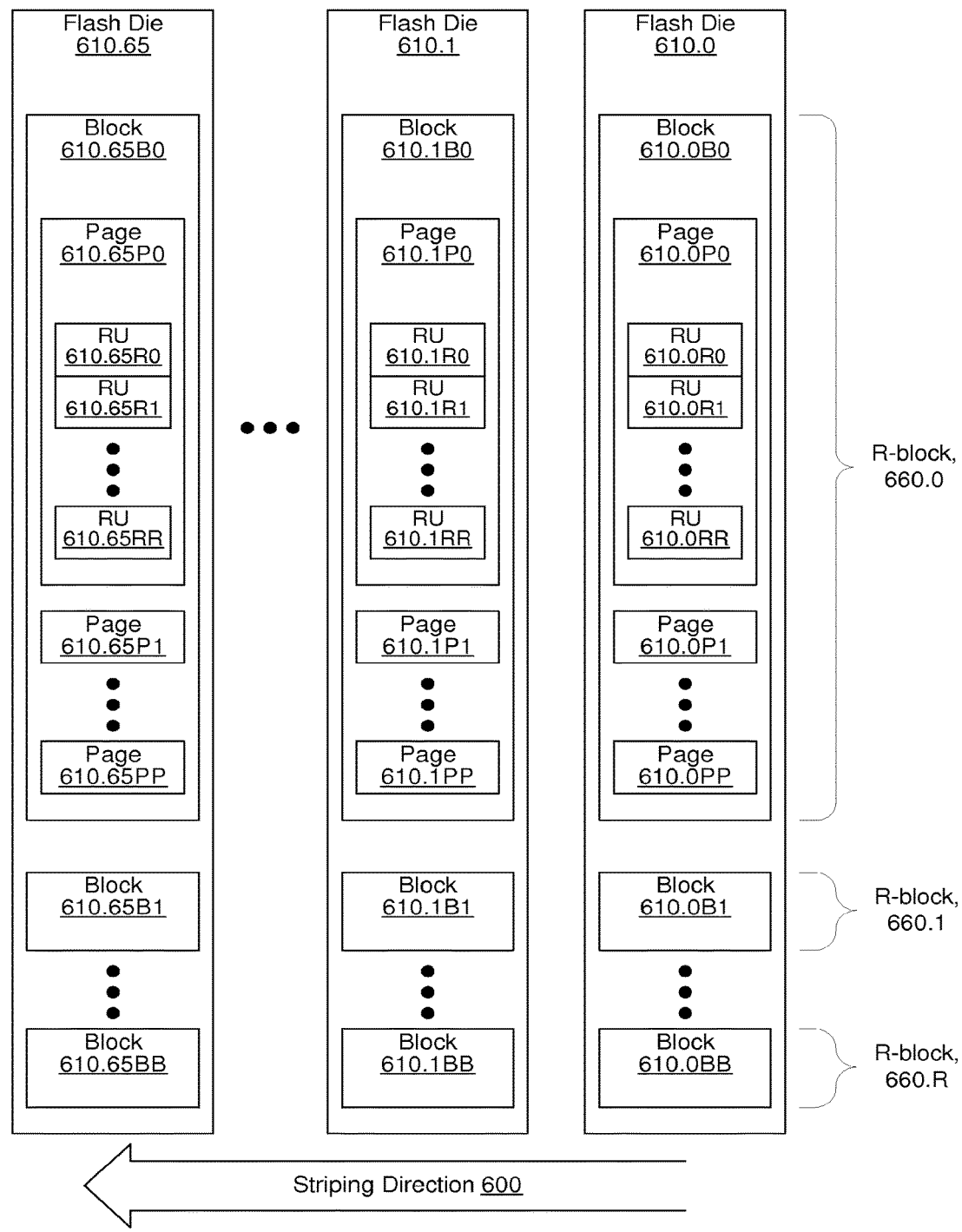
FIG. 6 illustrates selected details of an embodiment of blocks, pages, and read units of multiple NVM devices (e.g. one or more flash die and/or flash chips) managed in logical slices and/or sections.

FIG. 6 illustrates selected details of an embodiment of blocks, pages, and read units of multiple NVM devices (e.g. one or more flash die and/or flash chips) managed in logical slices and/or sections. The management functions include any one or more of reading, recycling, erasing, programming/writing, and other management functions. The logical slices and/or sections are sometimes referred to as R-blocks. The figure illustrates an embodiment with 66 flash die. Three of the flash die are explicitly illustrated (Flash Die 610.65, 610.1, and 610.0) and 63 of the flash die are implicitly illustrated (610.64 ... 610.2).

Each of the flash die (such as any one of Flash Die 610.65 ... 610.1, and 610.0) provides storage organized as blocks (such as Blocks 610.65BB ... 610.65B1, and 610.65B0 of Flash Die 610.65; Blocks 610.0BB ... 610.0B1, and 610.0B0 of Flash Die 610.0; and so forth). The blocks in turn include pages (such as 610.65PP ... 610.65P1, and 610.65P0 of Block 610.65B0; Pages 610.0PP ... 610.0P1, and 610.0P0 of Block 610.0B0; and so forth). The pages in turn include read units (such as read Units 610.65RR ... 610.65R1, and 610.65R0) of Page 610.65P0; read Units 610.0RR ... 610.0R1, and 610.0R0 of Pages 610.0P0; and so forth).

In some embodiments, each flash die includes an integer number of blocks (e.g. N blocks) and a block is a smallest quantum of erasing. In some embodiments, each block includes an integer number of pages and a page is a smallest quantum of writing. According to various embodiments, one or more of: a read unit is a smallest quantum of reading and error correction; each page includes an integer number of read units; as associated group of two or more pages includes an integer number of read units; and read units optionally and/or selectively span page boundaries.

In various embodiments, various NVM management functions (e.g. reading, recycling, erasing, and/or programming/writing) are performed in units of R-blocks. An R-block is exemplified as a logical slice or section across various die (e.g. all die, all die excluding ones that are wholly or partially failed, and/or one or more selected subsets of die) of, e.g., a flash memory. For example, in flash memory having R flash die, each flash die having N blocks, each R-block is the $i^{th}$ block from each of the flash die taken together, for a total of N R-blocks. Continuing with the example, if one of the R flash die fails, then each R-block is the $i^{th}$ block from each of the flash die except the failed flash die, for a total of N R-blocks, each R-block having one less block than before the failure. For another example, in a flash memory having a R flash die, each with N blocks, each R-block is the $i^{th}$ and $(i+1)^{th}$ block from each of the flash die, for a total of N/2 R-blocks. For yet another example, in a flash memory having a plurality of dual plane devices, each R-block is the $i^{th}$ even block and the $i^{th}$ odd block from each of the dual plane devices. For yet another example, in a flash memory having a plurality of multi-plane devices, each R-block includes blocks elected to maximize parallelism (e.g. during programming) provided by the multi-plane devices. Note that in the aforementioned example of R-blocks in dual plane devices, the dual-plane devices are example of multi-plane device, and the R-block being the $i^{th}$ even block and the $i^{th}$ odd block from each of the dual plane devices is an example of R-blocks including blocks selected to maximize parallelism. For a final example, in a flash memory having R flash die, an R-block is k non-contiguous blocks, such as blocks $i_1, i_2 \ldots i_k$ from each of the R flash die.

In various embodiments, with blocks treated in pairs or other associated groups as part of forming an R-block, respective pages from each block of an associated group of the blocks are also treated as a unit, at least for writing, forming a larger multi-block page. For example, continuing the foregoing dual plane example, a first page of a particular one of the even blocks and a first page of an associated one of the odd blocks are treated as a unit for writing, and optionally and/or selectively as a unit for reading. Similarly, a second page of the particular even block and a second page of the associated odd block are treated as a unit. According to various embodiments, a page of NVM as used herein refers to one or more of: a single page of NVM; a multi-block page of NVM; a multi-block page of NVM; and any other grouping or association of pages of NVM.

The figure illustrates a plurality of illustrative R-blocks, three of them explicitly (660.0, 660.1, and 660.R). Each illustrative R-blocks is the $i^{th}$ block from each of the flash die, taken together. E.g., R-blocks 660.0 is Block 610.65B0 form Flash Die 610.65, block 0 from Flash Die 610.64 (not explicitly illustrated), and so forth to Block 610.1B0 of Flash Die 610.1, and Block 610.0B0 of Flash Die 610.0. As there are N blocks per flash die, there are thus a total of N R-blocks (R-block 660.R ... R-block 660.1, and R-block 660.0).

Another example of an R-block is the $i^{th}$ block and the $(i+1)^{th}$ block from each of the flash die, taken together (e.g. Blocks 610.65B0 and 610.65B1 from Flash Die 610.65, blocks 0 and 1 from Flash Die 610.64 (not explicitly illustrated), and so forth to Blocks 610.1B0 and 610.1B1 from Flash Die 610.1 and Blocks 610.0B0 and 610.0B1 from Flash Die 610.0). There are thus N/2 R-blocks, if there are N blocks in each flash die. Yet another example of an R-block is the $i^{th}$ even and odd blocks from each of a plurality of dual plane devices. Other arrangements of flash die blocks for management as R-blocks are contemplated, including mapping between virtual and physical block addresses to ensure that R-blocks have one block from each die, even if some blocks are inoperable. In various embodiments, some of the N blocks in each flash die are used as spares so that the mapping between virtual and physical block addresses has spare (otherwise unused) blocks to replace defective ones of the blocks in the R-blocks.

In various embodiments, reads and/or writes of information in flash die are performed according to an order, such as a 'read unit first' or a 'page first' order. An example of a read unit first order for read units illustrated in the figure begins with Read Unit 610.0R0 followed by 610.1R0 ... 610.65R0, 610.0R1. 610.1R1 ... 610.65R1, and so forth, ending with 610.65RR. An example of a page first order for read units illustrated in the figure begins with read Unit 610.0R0 followed by 610.0R1 ... 610.0RR, 610.1R0, 610.1R1 ... 610.1RR ... 610.65R0, 610.65R1, and so forth, ending with 610.65RR.

In various embodiments, a writing and/or a striping order of data within an R-block is page (e.g. lowest to highest) first, across all devices (e.g. lowest to highest numbered devices, as suggested conceptually by Striping Direction 600), then the next highest page (across all devices), and so forth, continuing throughout the last page of the R-block. Specifically with respect to R-block 660.0, an example order begins with Page 610.0P0 (the first page in the first block of Flash Die 610.0), followed by Page 610.1P0 (the first page in the first block of Flash Die 610.1), and so forth continuing to Page 610.65P0 (the first page in the first block of Flash Die 610.65, and the last block of R-block 660.0). The example order continues with Page 610.0P1 (the second page in the first block of Flash Die 610.0), followed by Page 610.1P1 (the second page in the first block of Flash Die 610.1), and so forth continuing to Page 610.65P1 (the second page in the first block of Flash Die 610.65). The example continues in an identical order. The example order completes with Page 610.0PP (the last page in the first block of Flash Die 610.0), followed by Page 610.1PP (the last page in the first block of Flash Die 6120.1), and so forth ending with Page 610.65PP (the last page in the first block of Flash Die 610.65, and the last page in the last block of R-block 660.0).

In various embodiments, Flash Die 610.65 . . . 610.1, and 610.0 correspond to respective ones of one or more individual Flash Die 194, of FIG. 1A. In some embodiments, Flash Die 610.65 . . . 610.1, and 610.0 are a portion less than all of NVM 199. For example, in various embodiments, data is striped independently across multiple groups of flash die, and each of the groups of flash die is independently accessible.

Higher-Level Redundancy Techniques

Figure 7:
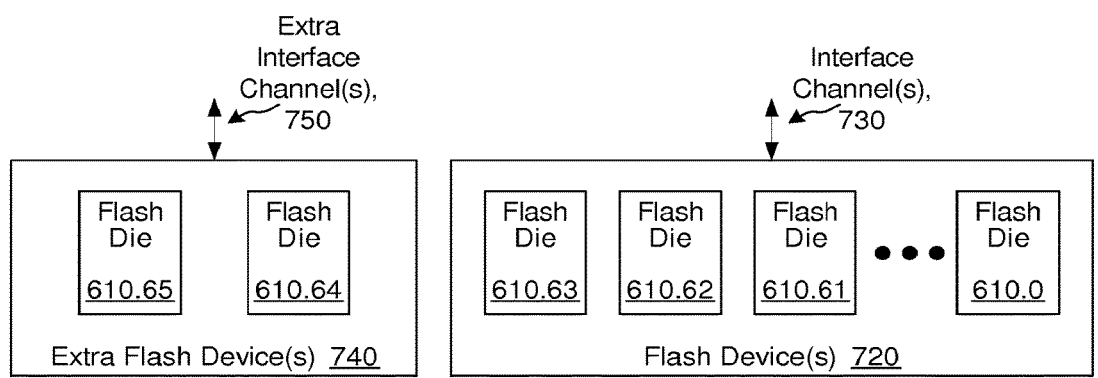
FIG. 7 illustrates selected details of various embodiments of higher-level redundancy techniques.

FIG. 7 illustrates selected details of various embodiments of higher-level redundancy techniques. Flash device(s) 720 includes 64 flash die (Flash Die 610.63, 610.62, 610.61 . . . 610.0 as explicitly and implicitly illustrated in FIG. 6) and communicates via Interface Channel(s) 730. Extra Flash Device(s) 740 includes up to two flash die (Flash Die 610.65 and 610.64 as explicitly and implicitly illustrated in FIG. 6) and communicates via Extra Interface Channel(s) 750. The Flash Die provide storage for higher-level redundancy information and data storage (e.g. user data and/or user free space) in a storage sub-system, such as NVM in an SSD. (Examples of 'user data' in contexts of redundancy information and data storage include all data other than the redundancy information stored on flash memory for later retrieval, such as operating system data, application data, SSD management data, and so forth.) Higher-level redundancy enables, e.g., recovering from intermittent or permanent failure of one or more portions of one or more flash die, such as a failure to provide error-corrected data (e.g. via lower-level ECC functions) for a read operation or failure to properly complete a write operation.

For example, each flash die (or alternatively each block or each page within each block) is operated in a context of a Redundant Array of Silicon Independent Elements (RASIE). If a failure is detected in a particular flash die (e.g. due to an ECC-uncorrectable read error of a portion of a block of the particular die), then in response, redundancy information stored in others of the flash die is used to determine information that would have been provided by the particular die. In some embodiments and/or usage scenarios, sufficient redundant information is stored to enable recovery from one failure within one flash die (during a single operation). Operation in a mode that enables recovery from a single failure includes, in some embodiments, allocating and managing space equivalent to one flash die for higher-level redundancy information, and is termed 'RASIE-1'. Operation in a mode that enables recovery from two failures includes, in some embodiments, allocating and managing space equivalent to two flash die for higher-level redundancy information, and is termed 'RASIE-2'. Operation in a mode that enables recovery from three failures includes, in some embodiments, allocating and managing space equivalent to three flash die for higher-level redundancy information, and is termed 'RASIE-3'. RASIE modes such as RASIE-1, RASIE-2, and RASIE-3 are respective examples of RASIE modes, as storage capacity equivalent to an integer multiple of one or more entire flash die (e.g. one, two and three entire flash die, respectively) is dedicated to higher-level redundancy information.

In some embodiments and/or usage scenarios, managing die-level failures is an objective, and spreading information amongst die is performed. For example, higher-level redundancy information is stored in one or more die specifically allocated solely to the higher-level redundancy information. In some embodiments and/or usage scenarios, managing block-level failures is an objective, and spreading information amongst block within a die is performed. For example, higher-level redundancy information is stored in one or more blocks allocated to the higher-level redundancy information, the allocation being without regard to which particular die the blocks were part of. In some embodiments and/or usage scenarios, managing particular-entity-level failures includes spreading information so that no more than N elements (e.g., for RASIE-1 and two for RASIE-2) are in any one of the particular entities. Examples of the entities include a (package) device, a die, an R-block, a block, an R-page (described elsewhere herein), a page, cells associated with a word line, and one or more pluralities of the foregoing.

The higher-level redundancy information is computed and written in accordance with (user) data written to the flash die, and is thus available to provide information when a failure is detected. In various embodiments, the higher-level redundancy information is written to the flash die before, after or in no particular time order with respect to writing of (user) data the higher-level redundancy information is associated with.

The figure illustrates various embodiments of RASIE operating modes, as summarized in the following table.

| Usage Mode | Usage of Extra Flash Device(s) 740 | Usage of Flash Device(s) 720 |
|---|---|---|
| RASIE-1 | | |
| 1-0 | -none- | 610.63 (1 die) - redundancy |
| | | 610.62 . . . 610.0 (63 die) - data storage |
| 1-1 | 610.64 (1 die) - redundancy | 610.63 . . . 610.0 (64 die) - data storage |
| RASIE-2 | | |
| 2-0 | -none- | 610.63, 610.62 (2 die) - redundancy |
| | | 610.61 . . . 610.0 (62 die) - data storage |
| 2-1 | 610.64 (1 die) - redundancy | 610.63 (1 die) - redundancy |
| | | 610.62 . . . 610.0 (63 die) - data storage |
| 2-2 | 610.65, 610.64 (2 die) - redundancy | 610.63 . . . 610.0 (64 die) - data storage |

More specifically, in RASIE-1 modes, space equivalent to one die is allocated to higher-level redundancy information. In RASIE-1 mode 1-0, Extra Flash device(s) 740 is not used, as higher-level redundancy information is stored in one die of Flash device(s) 720 (e.g. Flash Die 610.63, leaving 63 of the die (Flash Die 610.62 . . . 610.0) available for data storage (e.g. user data and/or user free space). In RASIE-1 mode 1-1, one die of Extra Flash Device(s) 740 is used (e.g. Flash Die 610.64), leaving all of Flash device(s) 720 (64 die) available for data storage.

In RASIE-2 modes, space equivalent to two die is allocated to higher-level redundancy information. In RASIE-2 mode 2-0, Extra Flash device(s) 740 is not used, as higher-level redundancy information is stored in two die of Flash Device(s) 720 (e.g. Flash Die 610.63 and flash Die 610.62), leaving 62 of the die (Flash Die 610.61 . . . 610.0) available for data storage. In RASIE-2 mode 2-1, one die of Extra Flash device(s) 740 is used (e.g., Flash Die 610.64), as higher-level redundancy information is partially stored in one die of Flash Device(s) 720 (e.g. Flash Die 610.63), leaving 63 of the die (Flash Die 610.62 . . . 610.0) available for data storage. In RASIE-2 mode 2-2, two die of Extra Flash device(s) 740 are used (e.g. Flash Die 610.65 and Flash Die 610.64), leaving all of Flash Device(s) 720 (64 die) available for data storage.

In some embodiments, die that are unused in all usage scenarios are unpopulated. For example, in a system operable only in RASIE-2-0 mode and RASIE-1-0 mode (but not in other RASIE modes), Extra Flash Device(s) 740 is unpopulated.

In some embodiments, higher-level redundancy information is stored entirely in "dedicated" die (e.g. Flash Die 610.63 in RASIE-1 mode 1-0 or Flash Die 610.65 and Flash Die 610.64 in RASIE-2 mode 2-2). In other embodiments, higher-level redundancy information is stored in any of the die, so for example, in RASIE-1 mode 1-0 Flash Die 610.62 is used for higher-level redundancy information, while Flash Die 610.63 and Flash Die 610.61 . . . 610.0 are used for data storage. In some embodiment and/or usage scenarios, higher-level redundancy information is stored in different die (and/or portions thereof) over time, some for example, in a first period a first flash die holds higher-level redundancy information while in a second time period a second flash die hold higher-level redundancy information.

In various embodiments, there are a plurality of RASIE 1-0 modes (and a plurality of RASIE 2-0 modes) depending on how many flash die are usable. For example, in a first RASIE 1-0 mode (as illustrated in the table above), Flash Die 610.63 stores higher-level redundancy information, and Flash Die 610.62 . . . 610.0 are available for data storage. In a second RASIE 1-0 mode, Flash Die 610.63 is no longer usable, Flash Die 610.62 stores higher-level redundancy information, and Flash Die 610.61 . . . 610.0 are available for data storage, decreasing as available amount of data storage by one die. RASIE modes where a die (or any portions thereof) previously available for data storage is no longer available for data storage due to use of the die (or the portions) for higher-level redundancy information are sometimes referred to as reduced-capacity RASIE modes.

In some embodiments, higher-level redundancy information is stored using a same and/or a similar lower-level redundancy and/or error correction coding scheme an user data protected by the higher-level redundancy information. Using a lower-level redundancy and/or error correction scheme to protect the higher-level redundancy information enables determining if there is an incorrect able error in the higher-level redundancy information, in a same and/or a similar manner that an uncorrectable lower-level error in the user data is determined.

In some embodiments, higher-level redundancy information is stored in different die for different portions of data. For instance, in some embodiments where flash die are managed in R-blocks, higher-level redundancy information is stored in different flash die for different R-blocks. For example, higher-level redundancy information for an R-block including block 0 of Flash Die 610.0 is stored in Flash Die 610.0, while higher-level redundancy information for an R-block including block 1 of Flash 610.0 is stored in Flash Die 610.1, and so forth. In some embodiments, such as some embodiments where flash die are managed in R-blocks, higher-level redundancy information is written after data the higher-level redundancy information depends on is known and/or is written.

In some usage scenarios, one or more portions of an NVM element (e.g. a block of a device, such as Block 610.0BB of Flash Die 610.0 of FIG. 6) are, or become during operation, inoperable. In some embodiments, the inoperable portions are mapped out via virtual and physical block addresses (e.g. via processing performed via Map 141 and/or Table 143 of FIG. 1A). Alternatively, the inoperable portions are skipped (rather than explicitly mapped out). In some embodiments based on R-blocks, the skipping results in some of the R-blocks having differing numbers of blocks. For example, if Block 610.0B0 is defective and unusable, then R-block 660.0 has one fewer block than R-block 660.1. The higher-level redundancy information is written in a (per R-block) variable location that is, for example, the last block of each R-block.

In various embodiments, one or more elements of FIG. 7 correspond to one or more elements of FIG. 1A. For example, Flash device(s) 720 and Extra Flash Device(s) 740 collectively correspond to NVM 199, and Interface Channel(s) 730 and Extra Interface Channel(s) 750 collectively correspond to the instances of Flash Die 194. For yet another example, one or more of the flash devices of Flash device(s) 720 and/or Extra Flash Device(s) 740 correspond to one or more of the instances of Flash device(s) 192. In various embodiments, one or more elements of FIG. 1A manage higher-level redundancy information and/or recover user data based at least in part on the higher-level redundancy information in accordance with the RASIE operating modes described herein. For example, a portion of software execution capabilities of CPU 171 is used to manage computation of higher-level redundancy information according to various RASIE operating modes. For another example, Data Processing 121 and/or ECC-X 135 includes hardware elements dedicated to and/or specialized for computation of higher-level redundancy information and/or recovery of user data according to various RASIE operating modes. For yet another example, ECC 161 detects an ECC-uncorrectable (lower-level) read error of a portion of a flash die, and ECC-X 135 detects a RASIE (higher-level) read error and/or enables correction thereof.

In various embodiments, Interface Channel(s) 730 variously has one, four, eight, or 16 channels, and Extra Interface Channel(s) 750 variously has one or two channels. In various embodiments, Flash device(s) 720 is implemented as one, two, four, eight, or 16 devices, each having respectively 64, 32, 16, eight, and four of the Flash Die. In various embodiments, Extra Flash Device(s) 740 is implemented as one device having one or two die or as two devices each having one die. In some embodiments, the Flash Die of Extra Flash Device(s) 740 are implemented in devices that also implement the Flash Die of Flash device(s) 720. For example, one flash device implements 66 flash die (Flash Die 610.65 . . . 610.0). For another example, two flash devices each implement 33 flash die, e.g. in a first flash device (Flash Die 610.65 . . . 610.33) and in a second flash device (Flash Die 610.32 . . . 610.0). Other arrangements of flash die and flash devices are contemplated. In some embodiments having Extra Flash device(s) 740 implemented in devices that also implement flash die of Flash Device(s) 720, the flash die communicates via shared interface channels, or alternatively via interface channels dedicated to particular ones (or sets) of the flash die. While Flash Device(s) 720 and Extra Flash device(s) 740 are illustrated with specific numbers of flash die (2 and 64, respectively), other embodiments are contemplated, such as Flash Device(s) 720 having 2, 4, 8, 16, 32, or 128 flash die, and/or Extra Flash Device(s) 740 having 0, 1, or 4 flash die.

Figure 8:
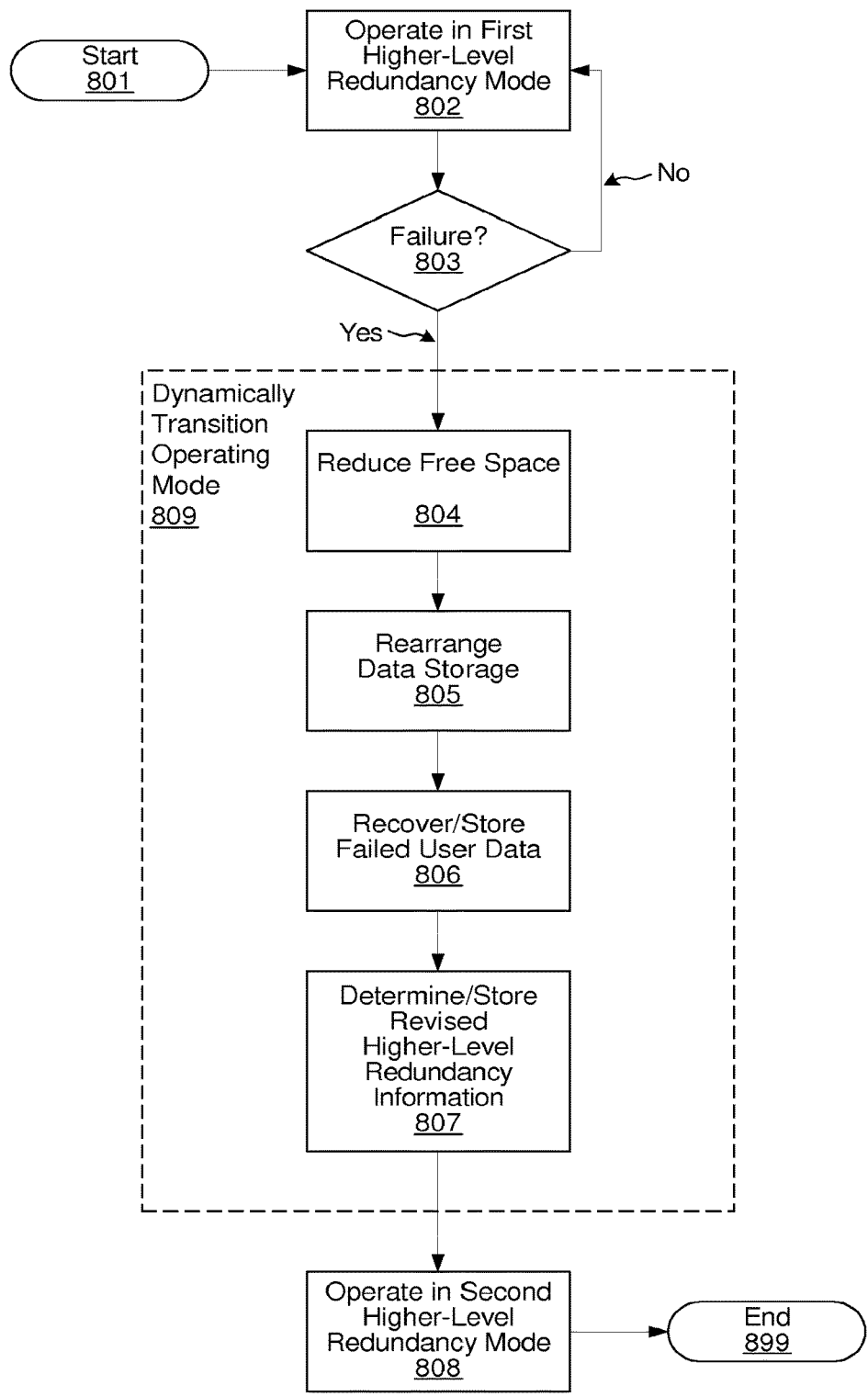
FIG. 8 illustrates selected details of an embodiment of dynamic higher-level redundancy mode management with a redundant Array of Silicon Independent Elements (RASIE).

FIG. 8 illustrates selected details of an embodiment of dynamic higher-level redundancy mode management with RASIE, such as dynamically switching between RASIE modes enabled by the various embodiments illustrated by FIG. 6 and/or FIG. 7. In some embodiments and/or usage scenarios, a form of graceful degradation is provided where a storage sub-system (e.g. an SSD) is dynamically transitioned from operating in first higher-level redundancy mode to operating in a second higher-level redundancy mode. The transition is in response to detection of a failure, such as a permanent or intermittent malfunction of an entire flash die or one or more portions thereof, or an operation (such as a read or write operation) thereof. According to various embodiments, the transition is one or more of: global for the SSD; performed on one or more subsets of the SSD; and performed on one or more R-blocks, blocks and/or pages of the SSD. For example, if a particular block of one of the NVM devices storing RASIE-2 information fails during programming, then subsequent operation of the R-block containing the particular (failed) block transitions to a different higher-level redundancy mode (e.g. a RASIE-1 mode), whereas other R-blocks in the SSD are unaffected and continue to operate in the RASIE-2 mode.

With respect to FIG. 8, processing begins with higher-level redundancy information and data storage (e.g. user data and/or user free space) arranged in flash die in accordance with a first higher-level redundancy mode (Operate in First Higher-Level redundancy Mode 802). Flow then processed to determine if a failure has been detected (Failure? 803), such as a lower-level uncorrectable read error or a write/program failure. If no failure has been detected, then flow proceeds back to continue operation in the first higher-level redundancy mode. If a failure has been detected, then flow proceeds to switch from operating in the first higher-level redundancy mode to operating in a second higher-level redundancy mode (Dynamically Transition Operating Mode 809).

The switch begins by (optionally) decreasing space available for data storage (Reduce Free Space 804) to account for the failure. If the second higher-level redundancy mode uses sufficiently less higher-level redundancy information than the first higher-level redundancy mode, then the decreasing of available space is omitted. The switch continues by reorganizing data storage in accordance with the second higher-level redundancy mode (Rearrange Data Storage 805). The reorganized includes optionally moving all user data and/or user free space from the flash die where the failure occurred to another one of the flash die (user free space movement is accomplished, in some embodiments, by manipulation of pointers and/or other data structure elements). The switch further continues by selectively restoring (if possible), via the higher-level redundancy information of the first higher-level redundancy mode, any usage data that was stored in the flash die where the failure occurred, and writing the restored user data to another one of the flash die, in accordance with the second higher-level redundancy mode (Recover/Store Failed User data 806). The restoring is omitted if the failure is a write/program failure. The switch further continues by optionally computing and writing to the flash die higher-level redundancy information in accordance with the second higher-level redundancy mode (Determine/Store revised Higher-Level redundancy Information 807). The computing and the writing are omitted of the second higher-level redundancy mode is operable with higher-level redundancy information that was previously in place due to operating in the first higher-level redundancy mode. Then operation beings in the second higher-level redundancy mode (Operate in Second Higher-Level Redundancy Mode 808).

The failure detection (Failure? 803) is via one or more of lower-level redundancy and/or error correction (e.g. in accordance with one or more ECC techniques), higher-level redundancy and/or error correction (e.g. in accordance with one or more RASIE techniques), and failing status reported by one or more of the flash die or portions thereof. For example, more than threshold number of lower-level error corrections of reads within a particular portion (e.g. R-block, block, R-page, page, read unit, or cells associated with a word line) of a particular flash die optionally and/or conditionally results in the particular flash die (or the particular portion) being treated as failed and a higher-level redundancy mode switch is performed so that the failed flash die (or portion) is no longer used. For another example, if a higher-level error correction fails, then an appropriate one of the flash die (or portion thereof) is treated as failed and a higher-level redundancy mode switch is performed so that the failed flash die (or portion) is no longer used. For yet another example, if a flash die returns a program failure status (indicating that a write operation was unsuccessful), then an appropriate block of an appropriate one of the flash die is treated as failed, and optionally and/or conditionally a higher-level redundancy mode switch is performed so that the failed flash die (or alternatively a portion thereof) is no longer used.

In some embodiments, a failed block is replaced by remapping via virtual and physical block addresses (e.g. via processing performed via Map 141 and/or Table 143 of FIG. 1A). A spare block from a pool of spare blocks is mapped in place of the failed block. Any contents written in the failed block are copied to the replacement block, and writing proceeds is the spare block from where the failure occurred in the failed block.

In some embodiments, a failed block is skipped (rather than explicitly remapped), resulting in a "hole" that optionally and/or conditionally results in a higher-level redundancy node switch when the R-block that the hole is in is next erased (in preparation for re-writing). If the hole is in a location for data storage, then no switch is made, and the hole remains. If the hole is in a location for higher-level redundancy information, then the higher-level redundancy information is stored in another location, and optionally the higher-level redundancy mode is switched.

In some embodiments and/or usage scenarios, restoration of user data stored in the flash die where the failure occurred is not possible. For example, if the failure is due to some types of failures detected via higher-level redundancy and/or error correction and/or some types of failing status reportedly by one or more of the flash die or portions thereof, then some user data is lost.

In some embodiments, processing of FIG. 8 is performed in a context of (e.g. an SSD controller) dynamically transitioning between higher-level redundancy modes in response to a plurality of failures. Specifically, the SSD controller begins operating in a first higher-level redundancy mode and dynamically transitions to a second higher-level redundancy mode in response to a first failure, and subsequently dynamically transitions from the second higher-level redundancy mode to a third higher-level redundancy mode in response to a second failure, and so forth. For instance, an SSD controller operates various flash die in accordance with a RASIE-2 mode 2-2 and dynamically transitions the operation to be in accordance with a RASIE-2 mode 2-1 in response to a first failure. Subsequently, the SSD controller dynamically transitions the operations to be in accordance with a RASIE-2 mode 2-0 in response to a second failure. Further subsequently, the SSD controller dynamically transitions the operation to be in accordance with a RASIE-1 reduced-capacity mode 1-0 in response to a third failure (the reduced capacity mode 1-0 being similar to RASIE-1 mode 1-0 except with one flash die used for higher-level redundancy information and 62 flash die used for data storage).

As a specific example, consider an SSD controller (such as SSD Controller 100 of FIG. 1A) coupled to the elements of FIG. 7, initially operating in RASIE-2 mode 2-2 (e.g. higher-level redundancy information in Flash Die 610.65 and Flash Die 610.64, and data storage in Flash Die 610.63 . . . 610.0), corresponding to operating in the first higher-level redundancy mode. Then a read, or alternatively a write, of one or more of the Flash Die is performed. The read results in an uncorrectable (lower-level) ECC failure, or alternatively the write is unsuccessful, in a portion of a particular one of the Flash Die (e.g. a page of Flash Die 610.62 user for user data and/or user free space). In response, the SSD controller dynamically switches from operating in RASIE-2 mode 2-2 to RASIE-2 mode 2-1, no longer using any of Flash Die 610.62. As operation in RASIE-2 mode 2-1 provides 63 die for data storage (versus 64 die in RASIE-2 mode 2-2), space available for data storage is decreased from 64 die to 63 die, and user data and/or user free space is moved accordingly. E.g., all user data from Flash Data 610.22 is moved to portions of Flash Die 610/63 and Flash Die 610.61 . . . 610.0 in accordance with user free space. An user data in the page having the uncorrectable ECC failure is recovered based on the higher-level redundancy information in Flash Die 610.65 and/or Flash 610.64. Higher-level redundancy information based on data storage in Flash Die 610.63 and Flash Die 610.61 . . . 610.0 and in accordance with RASIE-2 mode 2-1 is computed and stored in Flash Die 610.65 and/or Flash Die 610.64. The SSD controller then operates in RASIE-2 mode 2-1 (higher-level redundancy information in Flash Die 610.65 and Flash Die 610.64, and data storage in Flash Die 610.63 and Flash Die 610.61 . . . 610.0).

In various embodiments, processing of or relating to one or more elements of FIG. 8 is performed entirely or in part by one or more elements (or portions thereof) of FIG. 1A. For example, a portion of software execution capabilities of CPU 171 is used to manage dynamic transitioning between higher-level redundancy modes, such as by directing decreasing space available for data storage or directing reorganizing data storage. For another example, Data Processing 121 and/or ECC-X 135 includes hardware elements dedicated to and/or specialized for computation of higher-level redundancy information in accordance with a 'target' redundancy mode. For year another example, ECC 161 implements lower-level (e.g. ECC) error correction and detection of incorrect able errors, while ECC-X 135 implements higher-level (e.g. RASIE) error correction and detection of uncorrectable errors and/or memory element failures. For another example, all or any portions of functionally relating to dynamic transitioning between (higher-level) redundancy modes is performed by one or more portions of ECC-X 135.

Higher-Level Redundancy and Adaptive Lower-Level Code Rates

In some embodiments and/or usage scenarios, lower-level redundancy and/or error correction uses an adaptive code rate (e.g. an adaptive ECC technique using a variable code rate). For instance, a first read unit is managed with a first code rate that provides relatively more unstable data bits than a second read unit that is managed with a second code rate. In some embodiments and/or usage scenarios with lower-level redundancy and/or error correction using a variable code rate, higher-level redundancy information is stored in portions of independent silicon elements (such as portions of flash die) that are managed with lower-level redundancy and/or error correction that provides relatively more usable data bits or the most usable data bits with respect to data storage protected by the higher-level redundancy information. The portion(s) where the higher-level redundancy information is stored varies, in various embodiments and/or usage scenarios, on a per R-block basis, on a per-die basis, dynamically over time, or any combination thereof. In various embodiments, one or more die, R-blocks, blocks, and/or pages are selected for storage of higher-level redundancy data based on having the most usable data with respect to lower-level error correction code rate.

For example, higher-level redundancy information is stored at varying locations (such as block locations) on a per R-block basis, the locations (such as blocks) being those having the most usable data based in lower-level error correction code rate. In an arbitrary example, consider a RASIE-2 operating mode scenario in the context of FIG. 7, wherein the collection of 66 flash die is treated as a logical "stack" of up to M R-blocks of one-block height each, where M is the number of blocks per flash die. (In the most conceptually straightforward case, each R-block in the stack is made up of the same physical block number from each die, but to accommodate failed blocks this constraint is lifted in at least some embodiments. In yet other embodiments, the constraint is maintained, but "holes" are accommodated corresponding to the failed blocks). Thus, each R-block has up to 66 blocks, corresponding to one block from each of Flash Die 610.0 through flash Die 610.65. (In FIG. 7, while one some flash die in the range 610.0 through 610.65 are explicitly enumerated, it is understood by the use of ellipsis that all flash die on this range are implicitly illustrated.) The higher-level redundancy information is written into whichever blocks of each R-block have the most useable data based on lower-level error correction code rate. If for example in a first R-block, blocks corresponding to Flash Die 610.15 and 610.49 happen to have the most usable data based on lower-level error correction code rate, then higher-level redundancy information is written into those blocks (corresponding to Flash Die 610.15 and 610.35 happen to have the most usable data based on lower-level error correction code rate, then higher-level redundancy information is written into those blocks (corresponding to Flash Die 610.9 and 610.35) In some embodiments, the higher-level redundancy data is written after all other data in an R-block is known.

Figure 9:
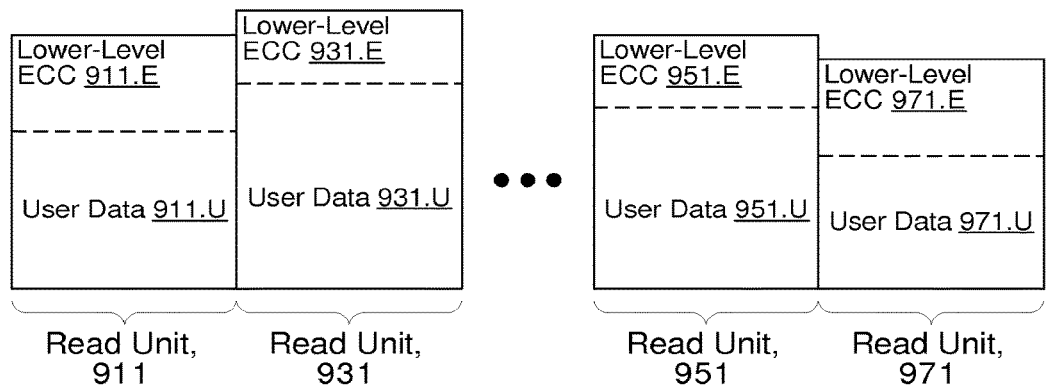
FIG. 9 illustrates an embodiment of read units having lower-level redundancy information of adaptive code rates protected by higher-level redundancy information stored in one or more of the read units.

FIG. 9 illustrates an embodiment of Read Units (911, 931 . . . 951, 971) having lower-level redundancy information of adaptive (e.g. differing and/or varying over time and/or by location) code rates protected by higher-level redundancy information stored in one or more of the read units. Each of the read units has a portion enabled and/or allocated to contain User Data (911.U, 931.U ... 951.U, 971.U), and a remaining portion enabled and/or allocated to contain lower-level redundancy information, such as check bits of an ECC code as Lower-Level ECC (911.E, 931.E ... 951.E, 971.E).

In the figure, vertical dimensions are relatively to scale and indicative of relative size. Thus Read Units 911 and 951 are of a same first size (in some embodiments, all read units are a same size for all blocks of all NVM devices), Lower-Level ECC portions 931.E and 951.E are of a same second size, and Lower-Level ECC portions 911.E and 971.E are of a same third size. Read Unit 931 is larger than read Units 911 and 951 that are in turn larger than read Unit 971. User Data portion 931.U is larger than User Data portion 951.U. User Data portions 951.U is larger than User Data portion 911.U. Lower-Level ECC portion 951.E is smaller than Lower-Level ECC portion 911.E.

As illustrated in the figure, respective read units have respective size, e.g. per respective block of NVM, enabling varying lower-level code rates as used in the respective blocks. More specifically, Read Units 931 and 951 have a same amount of lower-level redundancy information (931.E and 951.E are a same size), but a lower-level code rate of Read Unit 931 is higher than a lower-level code rate of Read Unit 951, as Read Unit 931 contains more User Data (931.U) than Read Unit 951 (containing User Data 951.U).

As illustrated in the figure, respective read units have respective sizes of user data, enabling various sizes of user data in each of two or more read units of same size. For example, a size of user data is varied to change a lower-level code rate used in a particular read unit. More specifically, Read Units 951 and 911 have a same size, but have different respective amounts of User Data (951.U and 911.U), and this different respective amounts of lower-level redundancy information (951.E and 911.E), enabling Read Unit 951 to have a higher lower-level code rate than Read Unit 911.

In some embodiments and/or usage scenarios, varying and/or changing a lower-level code rate advantageously enables proving a sufficient amount of lower-level ECC information to achieve lower-level error correction requirements while maximizing an amount of user data.

In some embodiments with a varying amount of user data in read units, higher-level redundancy information is stored in a one or more of the read units having a largest amount of user data. For example in FIG. 9, using a RASIE-1 mode, higher-level redundancy information is stored in User Data 931.U, and using a RASIE-2 mode, higher-level redundancy information is stored in User Data 931.U and User Data 951.U. Storing the higher-level redundancy information in read units with the largest amount of user data (among the read units protected by the higher-level redundancy information) ensures that there is sufficient higher-level redundancy information to protect the user data in all of the other read units.

According to various embodiments, one or more techniques are used to determine which of one or more read units among a number of read units protected by higher-level redundancy information are used to store higher-level redundancy information. In a first example, the latest-written one (for RASIE-1) or two (for RASIE-2) read units that have a largest amount of user data are used. In a second example, the earliest-written one (for RASIE-1) or two (RASIE-2) read units that have a largest amount of user data are used. Similarly, any technique to deterministically select one or more read units having a largest amount of user data so as to protect all of the remaining user data in the other read units is within the scope of the techniques considered herein.

Higher-Level Redundancy Information Computation Techniques

In various embodiments and/or usage scenarios, higher-level redundancy information is computed with a variety of techniques, such as via parity, RS, and/or weighted-sum techniques. For example, in some higher-level redundancy modes enabling recovery from one (lower-level) failure (e.g. RASIE-1), higher-level redundancy information is computed via parity techniques. For another example, in some higher-level redundant modes enabling recovery from two (lower-level) failures (e.g. RASIE-2), higher-level redundancy information is computed via a combination of parity and RS techniques. A first portion of the higher-level redundancy information is computed using parity coding and a second portion is computing using RS coding. For yet another example, in some higher-level redundancy modes enabling recovery from two failures (e.g. RASIE-2), higher-level redundancy information is computed via a combination of parity and weighted-sum techniques. A first portion of the higher-level redundancy information is computed using parity coding and a second portion is computing using weighted-sum coding. The higher-level redundancy information is managed, e.g. via reads and writes of pages of NVM, using lower-level failure detection techniques used for pages of the NVM available for storing data protected by the higher-level redundancy information.

As a specific example for RASIE-2, a first page of higher-level redundancy information is computed using parity coding via an XOR of all first pages in a stripe across an R-block. More specifically, an XOR is performed of all of the first bytes of all of the first pages in the stripe across the R-block, resulting in a first byte of the first page of higher-level redundancy information. Similarly, a second byte of higher-level redundancy information is formed by XORing all of the second bytes of all of the first pages in the stripe. A second page of higher-level redundancy information is computed using a weighted-sum technique as follows.

Arithmetic is performed over a finite field, such as a Galois Field (used as an example). Examples assumes data being operated on is byte-wide, and thus a field such as GF(256) is used. In various embodiments, data is operated on in any units.

Each page in a stripe is assigned a unique non-zero "index". The values of the indices are chosen to simplify implementation complexity, and are not related to any form of generator polynomial. For example, the pages are labeled (e.g. by software) by die location in a stripe from 0 to N−1, and a suitable value for the indices is the ones-complement of the die number (ensured to be non-zero provided N<255). Another selection of index values is the lowest-weight (ensured number of set bits or fewest number of clear bits) non-zero integers, e.g. to reduce and/or minimize hardware costs. Selecting gray-coded values for the indices, in some embodiments and/or usage scenarios, minimizes transitions and/or reduces power as pages are processed.

The index values are not selected according to finite field arithmetic, but are selected according to other principles. Notwithstanding this, each index value corresponds to a non-zero element in the finite field. Assume that page i has index value Ki (and page j has index value Kj). The weighted-sum redundancy is the (GF field) sum (over corresponding bytes Pi from each page i) of Ki*Pi, each byte multiplied (over the GF field) by its index value.

Thus weighted-sum redundancy information is computed for each byte as:

R0=sum over all corresponding bytes Pi;
R1=sum over all corresponding bytes Ki*Pi;

R0 is the XOR of all the corresponding bytes; and

R1 is a weighted sum of the bytes, where the weights are selected as the index values.

The foregoing computation is iterated for each of the corresponding bytes in a page, producing corresponding pages of bytes for each of R0 and R1. In the following discussion, R0 and R1 are described in some contexts respectively as single elements (e.g. each being a single byte) for clarity of exposition, but as in the foregoing computation, each are representative of a respective page of elements (e.g. each being a page of bytes).

Pi represents a byte in page i, and Pj represents a byte in page j. Processing is described with respect to one stripe of corresponding bytes from each page, and iteration is performed over all corresponding bytes. If some pages are "shorter" than others, due to for example to having a different (lower-level) redundancy code rate, then the shorter pages are zero-padded (or padded by any known value used the same way on encode and decode) so that all pages that are processed effectively have the same size.

Summations to compute R0 and R1 are performable in any order, via various serial and/or parallel computations, according to various embodiments. Pages do no have to be processed in any specific order as whether Ki*Pi is added in prior to or subsequent to Kj*Pj has no effect on the result in R1. Computation of R0 and R1 values corresponding to various bytes of a page of redundancy information are independent of each other and are compatible in any order, via various serial and/or parallel computations, according to various embodiments. Further, subtracting Ki*Pi from R1 (and subtracting Pi from R0) enables "backing out" of computation effects in pages. Since over a GF field, addition and subtraction are both XOR (thus subtracting is equivalent to simply adding in a second time), in some embodiments and/or usage scenarios, no special hardware is needed for GF field implementations (e.g. a logical XOR capability is sufficient) to "back out" a page.

In the event of an uncorrectable lower-level error, higher-level error correction begins, in some embodiments, by re-computing R0 and R1, but by omitting page(s) (sometimes referred to as column(s)) that have uncorrectable lower-level errors. Correction proceeds by subtracting the recomputed R0 from the original R0 to produce ΔR0, and subtracting the recomputed R1 from the original R1 to produce ΔR1.

If there are no uncorrectable lower-level errors, then the recomputed R0 and R1 are both zero. If there are uncorrectable lower-level errors, then the recomputed R0 and R1 (after the subtraction) reflect the "missing" data (that was not added in the second time, but was present in the original values).

If there is one uncorrectable lower-level error, then the recomputed R0 is used to correct the error (and the recomputed R1 is not needed).

If there are two uncorrectable lower-level errors, then the recomputed R0 and R1 are used to correct the errors. If both the pages of R0 and R1 values are the pages with uncorrectable lower-level errors, then no correction of data storage pages is needed. If the page of R1 values is one of the pages with the uncorrectable lower-level errors, then correction is via R0 (the recomputed R) value is the value of the data storage page with uncorrectable lower-level errors).

If there are two uncorrectable lower-level errors in data storage pages, or if the R0 page is one of the pages with uncorrectable lower-level errors, then correction starts by computing ΔR0 and ΔR1 as above. If the R0 page is one of the pages with uncorrectable lower-level errors, computation of the ΔR0 page is optionally omitted. If page i and page j are pages with uncorrectable lower-level errors, then the recomputed ΔR0=Pi+Pj, and the recomputed ΔR1=Ki*Pi+Kj*Pj. Equation solving produces:

$$Pi=(\Delta R1-Kj*\Delta R0)/(Ki-Kj)$$

$$Pj=\Delta R0-Pi$$

If R0 is one of the pages with uncorrectable lower-level errors, then (because R0 is not included in R1), ΔR1=Ki*Pi, or Pi=ΔR1/Ki; the same result obtained by setting Kj=0 in the formulas above (to ignore ΔR0).

In an alternative embodiment, a finite field defined by integers mod p, where p is a prime, is used instead of a Galois Field. The computations are identical to those described above, with addition being integer addition mod p, and multiplication being integer multiplication mod p. For example, if pages are pages of bytes, a finite field of integers mod 257 is used. All user data bytes are in a range 0-255 and are stored in one byte each. R1 results, however, have values ranging from 0-256, requiring more than one byte for representation. There are many ways to encode values form 0-256 to minimize storage space and enable the R1 page to be stored with reduced overhead. For example, values 0 and 256 are stored as nine-bit sequences 000000000 and 000000001 respectively, and all other values are stored in eight bits. Given a random distribution of R1 values, storage overhead is <0.1%. As described with respect to FIG. 9, the R1 page is selected to have a largest amount of user data, enabling the storage overhead to be hidden in some usage scenarios.

Figure 10:
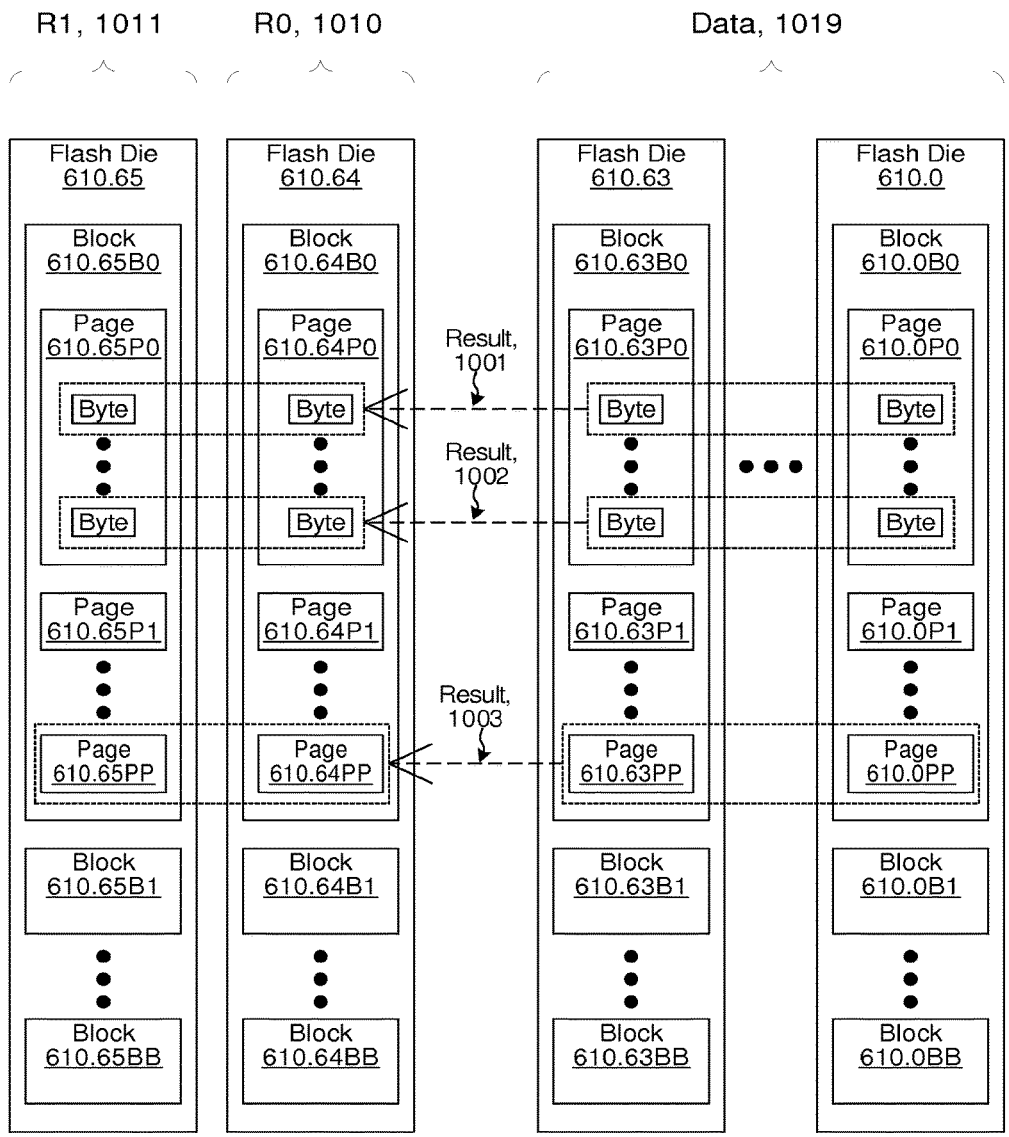
FIG. 10 illustrates selected details of an embodiment of higher-level redundancy information result and data source correspondences.

FIG. 10 illustrates selected details of an embodiment of higher-level redundancy information result and data source correspondences, for instance as used by RASIE-2 mode 2-2 in a context such as FIG. 7 and as further illustrated in FIG. 6. FIG. 10 explicitly illustrates Flash Die 610.0, 610.63, 610.64 and, 610.65, and by ellipsis ( . . . ) implicitly illustrates Flash Die 610.1 . . . 610.62. Selected details of blocks, pages, and bytes within pages of the Flash Die are illustrated. A first portion of higher-level redundancy information is illustrated as R0 1010 (stored in Flash Die 610.64), and is computed using parity coding. A second portion of higher-level redundancy information is illustrated as R1 1011 (stored in Flash Die 610.65), and is computed using weighted-sum coding. Storage for data information is illustrated as Data 1019 (stored in Flash Die 610.0 . . . 610.63).

Dashed-arrow 1001 conceptually indicates a two-byte redundancy computation results (one byte for each of R0 1010 and R1 1011) based on corresponding first bytes of all first pages (across all flash die) of Data 1019. As illustrated, the two-byte result is in the first byte on each of the first R0 and R1 pages. Dashed arrow 1002 conceptually indicates a two-byte redundancy computation result (one byte for each of R0 1010 and R1 1011) based on corresponding last bytes of all first pages of Data 1019. As illustrated, the two-byte result is the last byte on each of the first R0 and R1 pages. Dashed-arrow 1003 conceptually indicates a two-page redundancy computation result (one page for each of R0 1010 and R1 1011) based on corresponding last pages of the first blocks (across all flash die) of data 1019.

Note that as described elsewhere herein, in some embodiments higher-level redundancy information is stored in different die for different portions of data. Thus, R0 and R1, in some embodiments, are stored across various die, rather than two "dedicated" die, as illustrated in FIG. 10.

FIG. 11 illustrates selected details of an embodiment of higher-level redundancy information computations, for instances as used by RASIE-2 mode 2-2 in a context such as FIG. 7 and as further illustrated in FIG. 6 and FIG. 10 with various operating conditions according to various embodiments. More specifically, FIG. 11 illustrates parity coding computation for a byte of R0 and weighted-sum coding computation for a byte of R1, in accordance with, e.g., the two-byte redundancy computation result illustrated conceptually by dashed-arrow 1001 of FIG. 10. The operating condition include one or more of: performing arithmetic over a finite filed (such as a Galois Field), indices (corresponding to dummy summation variable "i" values in FIG. 11) being ones-complement of flash die number (or any other unique and non-zero numbering), and indices corresponding to non-zero elements in the finite field. The computation as illustrated in FIG. 11 is repeated for all of the bytes of R0 and R1, based on the corresponding data bytes. Note that non-zero indices enable R1 values to include a contribution from every element of Pi.

Thus there are no dependencies on computing any of the bytes of R0 on each other or between any of the bytes of R1. Therefore various embodiments are contemplated where R0 and R1 values are computed entirely (massively) in parallel, partially in parallel, or entirely in serial. For example, all of the R0 and/or R1 bytes of a page are computed in parallel. For another example, all of the R0 bytes of a page are computed in parallel followed (or preceded) by computing in parallel all of the R1 bytes of a page.

Further, there are no ordering requirements on computing any of the bytes of R0 with respect to each other or with respect to computing any of the bytes of R1. Therefore various embodiments are contemplated where R0 and R1 values are computed entirely in-order with respect to each other, in-order with respect to each other separately (e.g. R0 computations are in-order with respect to each other but with no ordering with respect to R1, and vice-versa), or with no particular ordering (e.g. entirely out-of-order, unordered, or randomly ordered). For example, all of the R0 bytes of a page are computed in a particular order (e.g. from lowest byte to highest byte), followed by all of the R1 bytes of the page in the particular order. For another example, all of the R0 bytes of a page are computed in the particular order, and independently all of the R1 bytes of the page are computed in the particular order. For yet another example, all of the R0 bytes of a page as well as all of the R1 bytes of a page are computed in no particular order with respect to each other (e.g. data operands become available).

For yet another example, all of the R0 and R1 bytes of one or more pages are computed in an order determined by an order of completion of one or more read operations performed on one or more NVMs (each having, e.g., one or more flash die), the read operations for reading the data bytes references by the summation and weighted-summation computations (Pi) illustrated in FIG. 11. Performing the computations in the order determined by the completing of the read operations enables, in some embodiments an/or usage scenarios, reduction or elimination of buffering between the NVMs and elements enabled to perform the computations. Performing the computation in the order determined by the completing of the read operations enables, in some embodiments and/or usage scenarios, reduction in memory bandwidth used to perform the computations, such as memory bandwidth of the NVMs.

For yet another example, all of the R0 and R1 bytes of one or more pages are computed in an order determined by an order of data returned and/or data available in response to read operations performed on one or more NVMs (each having, e.g., one or more flash die), the data returned and/or data available corresponding to the data bytes referenced by the summation and weighted-summation computations (Pi) illustrated in FIG. 11. In some embodiments and/or usage scenarios, performing the computations in the order determined by the data returned and/or data available reduces or eliminates buffering between the NVMs and elements enabled to perform the computations. In some embodiments and/or usage scenarios, performing the computations in the order determined by the data returned and/or data available reduces memory bandwidth used to perform the computations, such as memory bandwidth of the NVMs. In some embodiments, the read operations are performed in a particular order (e.g. from lowest byte to highest byte of Pi), while in other embodiments, the read operations are performed in no particular order.

FIG. 12 illustrates selected details of an embodiment of recovery from one (lower-level) failure (during a single operation), for instance in a context such as associated with FIG. 11, and where the lower-level failure has occurred on page j. Note that if the lower-level failure is on an R0 or an R1 page, then R0 (or R1) is re-determined as described by FIG. 11. FIG. 12 illustrates a computation for one byte of a recovered value for page j (note that the summation omits page j where the failure occurred). The computation as illustrated in FIG. 12 is repeated to determine recovered values for all of the bytes of page j, based on corresponding bytes of R0 and corresponding bytes from all of the data pages except for page j.

Thus there are no dependencies on computing any of the bytes of the recovered values of page j on each other. Therefore various embodiments are contemplated where Pj recovery values are computed, ranging from highly parallel to highly serial, similarly to the aforementioned computations for R0 and R1 values. Further, there are no order requirements on computing any of the recovery values of page j with respect to each other. Therefore various embodiments are contemplated where Pj recovery values are computed in varying orderings with respect to each other, similarly to the aforementioned computations for R0 and R1 values.

Some exemplary embodiments perform computations related to determining recovery values in orderings at least in part determined by an ordering of completion of one or more read operations performed on one or more NVMs (each having, e.g., one or more flash die), the read operations for reading the NVMs to obtain R0 and/or Pi values as illustrated by FIG. 12. Performing the computation in the order of the completing of the read operation enables, in some embodiments and/or usage scenarios, reduction or elimination of buffering between the NVMs and elements enabled to perform the computations. Performing the computations in the order of the completion of the read operations enables, in some embodiments and/or usage scenarios, reduction in memory bandwidth used to perform the computations, such a memory bandwidth of the NVMs.

Some exemplary embodiments perform computations related to determining recovery values in orderings at least in part determined by an ordering of data returned and/or data available from one or more NVMs (each having, e.g., one or more flash die), the data returned and/or data available being in response to read operations performed on the NVMs to obtain R0 and/or Pi values as illustrated in FIG. 12. In some embodiments and/or usage scenarios, performing the computations in the order of the data returned and/or data available from the read operations reduces or eliminates buffering between the NVMs and elements enabled to perform the computations. In some embodiments and/or usage scenarios, performing the computations in the order of the data returned and/or data available from the read operations reduces memory bandwidth used to perform the computations, such as memory bandwidth of the NVMs. In some embodiments, the read operations are performed in a particular order (e.g., from lowest byte to highest byte of Pi), while in other embodiments, the read operations are performed in no particular order.

FIGS. 13A-13D illustrates selected details of an embodiment of recovery from two (lower-level) failures (during a single operation), for instance in a context such as associated with FIG. 11, and where the lower-level failures have occurred on pages m and n. Note that if the lower-level failures are on R0 and R1 pages, then R0 and R1 are unneeded for data recovery, and there is no processing to recover data. Otherwise, note that if one of the lower-level failures is an R1 page, then data recovery proceeds as described by FIG. 12. If neither of the lower-level failures are on R0 or R1 pages, then recovery of Pm and Pn values proceeds as follows. FIG. 13A illustrates computations for one byte of a revised R0 as R0' and for one byte of a revised R1 as R1' (note that the summations omit pages m and n where the failures occurred). FIG. 13B illustrates equalities relating one byte of the original redundancy information (R0, R1) to the revised redundancy information (R0', R1'), and the terms omitted from summation used to form the revised R0 and R1 (Pm+Pn and Km*Pm+Kn*Pn). FIG. 13C illustrates an algebraic rearrangement of FIG. 13B, with introduced terms delta R0 ($\Delta$R0) and delta R1 ($\Delta$R1). FIG. 13D illustrates a solution of FIG. 13C for Pn and Pm, and thus represent computations for one byte of a recovered value for page n and one byte of a recovered value for page m, based on the pages m and n. Note that unique indices enable a non-zero denominator, as Kn is unique worth respect to Km.

In various embodiments, computations as represented by FIGS. 13A-13D are performed to determine one byte of a recovered value for page m and one byte of a recovered value for page n. The computations are repeated to determine recovered values for all of the bytes of pages m and n, based on corresponding bytes of R0, R1, and corresponding bytes from all of the data pages except for pages m and n.

Thus there are no dependencies on computing any of the bytes of the recovered values of pages m or n on each other. Therefore various embodiments are contemplated where Pm and/or Pn recovery values are computed ranging from highly parallel to highly serial, similarly to the aforementioned computations for Pj recovery values. Further, there are no order requirements on computing any of the recovery values of page m and/or page n with respect to each other. Therefore various embodiments are contemplated where Pm and/or Pn recovery values are computed in varying orderings with respect to each other, similarly to the aforementioned computations for Pj recovery values.

Some exemplary embodiments perform computations related to determining recovery values (such as computations for R0' and R1') in orderings at least in part determined by an ordering of completion of one or more read operations performed on one or more NVMs (each having e.g., one or more flash die), the read operations to obtain any one or more of values illustrated as sources for computations in any of FIGS. 13A-13D. Performing the computations in the order of the completion of the read operations enables, in some embodiments and/or usage scenarios, reduction or elimination of buffering between the NVMs and elements enabled to perform the computations. Performing the computations in the order of the completing of the read operation enables, in some embodiments and/or usage scenarios, reductions in memory bandwidth used to perform the computations, such as a memory bandwidth of the NVMs.

Some other exemplary embodiments perform computations related to determining recovery values (such as computations for R0' and R1') in orderings at least in part determined by an ordering of data returned and/or data available from one or more NVMs (each having, e.g., one or more flash die), the data returned and/or data available being in response to read operations performed on the NVMs to obtain any one or more of values illustrated as sources for computations in any of FIGS. 13A-13D. In some embodiments and/or usage scenarios, performing the computations in the order of the data returned and/or data available from the read operations reduces one eliminates buffering between the NVMs and elements enabled to perform the computations. In some embodiments and/or usage scenarios, performing the computations in the order of the data returned and/or data available from the read operations reduces memory bandwidth used to perform the computations, such as memory bandwidth of the NVMs. In some embodiments, the read operations are performed in a particular order (e.g. from lowest byte to highest byte of Pi), while in other embodiments, the read operations are performed in no particular order.

Figures 14A, 14B:
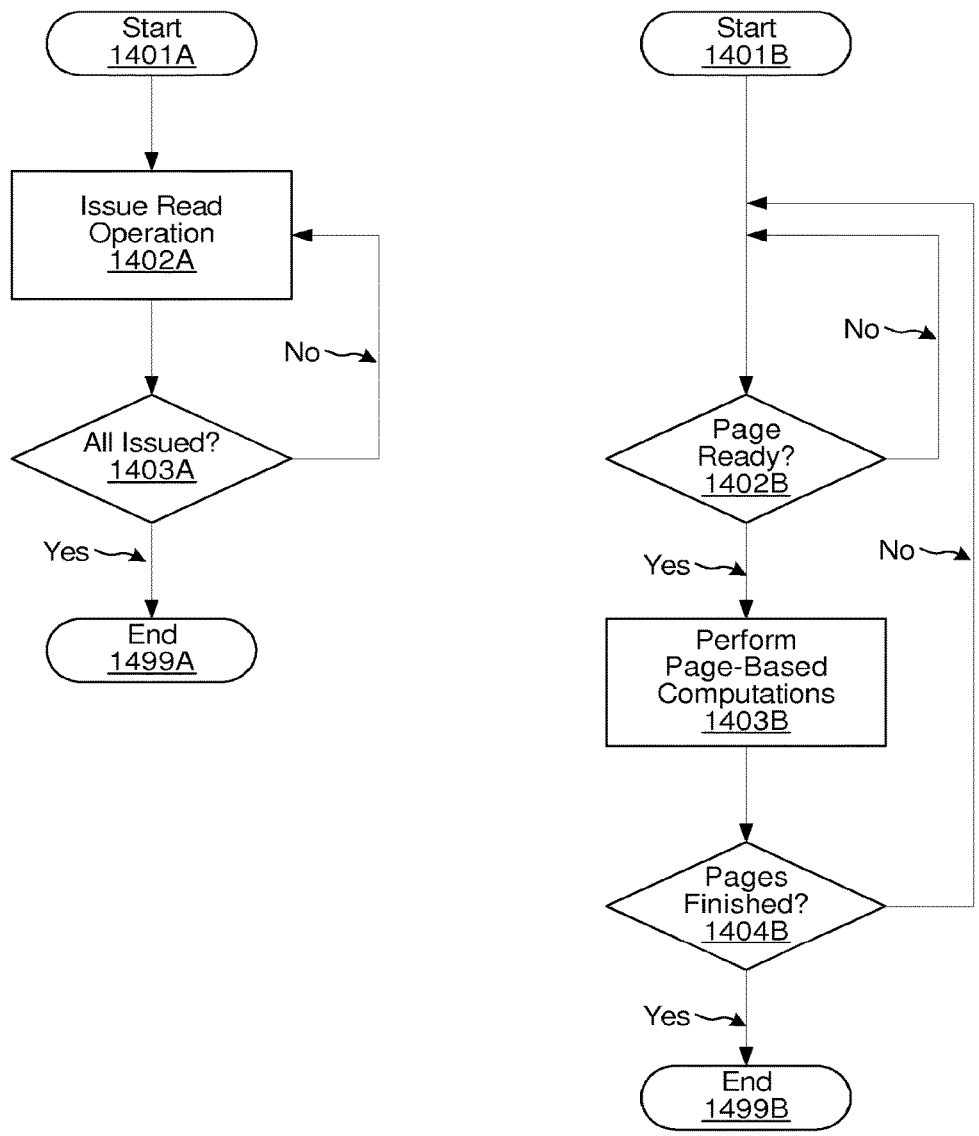
FIGS. 14A and 14B illustrate selected details of an embodiment of computing higher-level redundancy information with respect to pages received from NVMs.

FIGS. 14A and 14B illustrates selected details of an embodiment of computing higher-level redundancy information with respect to pages received from NVMs. FIG. 14A illustrates selected details of an embodiment of sending a plurality of read commands to one or more NVMs via issuing (Issue Read Operation 1402A), checking if all of the commands have been sent (All Issued? 1403A), and if not, then looping back to send another of the commands. Note that other embodiments are contemplated where a plurality of commands are issued at a time, rather than one at a time.

FIG. 14B illustrates selected details of an embodiment of processing pages received from the NVMs in response to the read commands sent as illustrated in FIG. 14A. A check is made to determine if a page is available (Page Ready? 1402B). If not, then processing loops back to perform the check again. If a page is available, then higher-level redundancy information processing relating to the page is carried out (Perform Page-Based Computations 1403B). Then a check is made to determine if all pages have been processed (Pages Finished? 1404B). If so, then processing is complete (End 1499B), otherwise flow loops back to determine if another page is available.

Other than reception of pages in response to the commands sent as illustrated in FIG. 14A, the processing illustrated in FIG. 14B is independent of processing illustrated in FIG. 14A. In various scenarios, arrival order of the pages various according to the NVM type, state, operating environment, and other factors, and in some circumstances is different than sending order or arrival order of the read commands corresponding to the arriving pages. As processing of FIG. 14A is independent of FIG. 14B (other than page data arrival being dependent on a corresponding read command being sent), in some embodiments and/or usage scenario, read commands are being sent (FIG. 14) while read data is being received/processed (FIG. 14B). In some embodiment and/or usage scenarios, some of the pages are provided from one or more buffers rather than being requested via read commands directed to the NVMs, for example if a particular page is present in a particular buffer before a read command for the particular page is to be sent. In some embodiments and/or usage scenarios, pages other than in response to the commands sent are provided by the NVMs intermixed with the pages provided in response to the commands sent, e.g. pages provided in response to read command sent for other activities.

In various embodiments, computations for R0 and R1, as illustrated by FIG. 11, are performed at least in part as illustrated by FIGS. 14A and 14B. For a first example, read commands for all data pages necessary to compute corresponding R0 and R1 pages are sent to one or more NVMs as illustrated by FIG. 14A. The pages of data received in response to the read commands are processed as the pages are received to compute the R0 and R1 pages, as illustrated by FIG. 11. For a second example, read commands for a pair (corresponding, e.g., to two planes of a dual-plane NVM) of R0 and R1 pages are sent to one or more NVMs as illustrated by FIG. 14A. The pages of data received in response to the read commands are processed as the pages are received to compute the R0 and the R1 pages, as illustrated by FIG. 11.

In various embodiments, computations for Pj, as illustrated by FIG. 12, are performed at least in part as illustrated by FIGS. 14A and 14B. For a first example, read commands for all data pages necessary to compute a particular Pj page are sent to one or more NVMs as illustrated by FIG. 14A. The pages of data received in response to the read commands are processed as the pages are received to compute the Pj page, as illustrated by FIG. 12. For a second example, read commands for a pair of Pj pages (corresponding, e.g., to two planes of a dual-plane NVM) are sent to one or more NVMs as illustrated by FIG. 14A, and the pages of data received are processed as received, as illustrated by FIG. 14B, to compute the pair of Pj pages.

In various embodiments, computations related to determining recovery values (such as computations for R0' and R1'), as illustrated by any of FIGS. 13A-13D, are performed at least in part as illustrated by FIGS. 14A and 14B. For a first example, read commands for all data pages necessary to compute a particular R0' page and a particular R1' are sent to one or more NVMs as illustrated by FIG. 14A. The pages of data received in response to the read commands are processed as the pages are received to compute the R0' and R1' pages, as illustrated by FIG. 13A. For a second example, read commands for a pair of R0' and R1' pages (corresponding, e.g., to two planes of a dual-plane NVM) are sent to one or more NVMs as illustrated by FIG. 14A, and the pages of data received are processed as received, as illustrated by FIG. 14B, to compute the pair of R0' and R1' pages.

FIGS. 15A-15C illustrate selected details of an embodiment of backing out of a computation of higher-level redundancy information with respect to a write provided to NVMs, for instance in a context such as associated with FIG. 11. FIG. 15A illustrates selected details of an embodiment of sending a plurality of write command to one or more NVMs via issuing (Issue Write Operation 1502A), checking if all of the commands have been sent (All Issued? 1503A), and if not, then looping back to send another of the commands. Note that other embodiments are contemplated where a plurality of commands are issued at a time, rather than one at a time.

FIG. 15B illustrates selected details of an embodiment of processing write completion and status information received from the NVMs in response to the write commands sent as illustrated in FIG. 15A. A check is made to determine if a write has completed without errors (Write OK? 1502B). If so, then a check is made to determine if all writes have been completed (Writes Finished? 1504B). If so, then processing is complete (End 1599B). If a write has been completed but with a (lower-level) error such as a program failure, then the flow proceeds to "undo" the effect of the write with respect to higher-level redundancy information computation (Back-out Write from Redundancy 1503B). More specifically, data for the write with the lower-level error is de-computed from any corresponding higher-level redundancy information computations (assuming that the data for the write had already been included in the corresponding higher-level redundancy computations under a presumption that the write would succeed). For example, a lower-level write failure is detected on a particular page j. In response, revised R0 and R1 pages are computed such that page j data (Pj) is set to zero. FIG. 15C illustrates selected details of an embodiment of a computation for a single byte of a revised R0 (nR0) and a single byte of a revised R1 (nR1), where j is the page of the lower-level write failure. Note that in contexts of FIG. 12 such as associated with FIG. 11, if the finite field is a Galois Field the subtraction operation ("−") illustrated in FIG. 15C is equivalent to a logical XOR operation. Other processing (not illustrated) is performed, in various embodiments, to store the page with the lower-level write failure (Pj), as well as the revised higher-level redundancy pages (nR0 and nR1).

Other than reception of write completing and status information in response to the commands sent as illustrated in FIG. 15A, the processing illustrated in FIG. 15B is independent of processing illustrated in FIG. 15A. In various scenarios, arrival order of the write completion and status information varies according to the NVM type, state, operating environment, and other factors, and in some circumstances is different than sending order or arrival order of the write commands corresponding to the arriving write completion and status information. As processing of FIG. 15A is independent of FIG. 15B (other than write completion and status information arrival being dependent on a corresponding write command being sent), in some embodiments and/or usage scenarios, write command are being sent (FIG. 15A) while write completion and status information is being received/processed (FIG. 15B).

In some embodiments and/or usage scenarios, a significant latency transpires between write commands being sent to the NVMs and reception of write completion and status information from the NVMs in response to the write commands. In some embodiments and/or usage scenarios, write completion and status information other than in response to the commands sent as illustrated in FIG. 15A are provided by the NVMs intermixed with the write completion and status information provided in response to the command sent as illustrated in FIG. 15A, e.g. write completion and status information provided in response to write commands sent for other activities.

In various embodiments and/or usage scenarios, one or more pages that would otherwise be used for data information are unused. In various scenarios an unused page is a first, middle, or last page of a block, R-block, stripe, or sequence of pages any kind. In some circumstances, unused pages are unused a priori ("left out"), and in some circumstances unused pages are unused after some use ("removed from service"). An example of an unused page that is left out is a page that is manufacture incorrectly. An example of an unused page that is left out is a page that is manufactured incorrectly. An example of an unused page that is removed from service is a page that fails to write properly (e.g. as described as a lower-level write error with respect to FIG. 15B). Processing, e.g. relating to FIGS. 10-12, 13A-13D, 14A-14B, and 15A-15B, skips over any unused pages (whether left out or removed from service), such as by omitting the unused pages entirely from computations, or by performing computations as if all data on the unused pages were zero.

Program Failure Recovery Via Redundant Arrays

In some circumstances, writing/programming of data to NVM is not successful, e.g. one or more writing/programming operations fail, as indicated by the NVM. In various embodiments, data that is sent to the NVM for writing/programming is retained in a buffer at least until the NVM indicates that all the data has been successfully written/programmed to the NVM (or alternatively indicates failure of one or more write-programming operations associated with the data). Retaining the data in the buffer enabled writing/programming the data associated with the failure to alternate locations in the NVM (such as another location in the die of the failure, later in a stream associated with the data, or any other suitable region of the NVM).

Some NVMs preclude further writing/programming of a block that has failed to properly complete one or more writing/programming operations. Some NVM vendors recommend moving data written/programmed to a block (before the writing/programming failure) out of the failing block as soon as practical. In some NVMs, data previously provided to the NVM for writing/programming (e.g. data associated with the failure) is not obtainable from the NVM. Retaining the data in the buffer enables recovery from the failure, even in contexts where the data is not obtainable from the NVM.

In some embodiments, the buffer is implemented as part of an NVM controller (such as an SSD controller, e.g., as illustrated in FIG. 1A and described elsewhere herein). For example, the buffer is implemented as all or any portions of Buffer 131 of FIG. 1A. In some embodiments implementing the buffer as part of the NVM controller (such as in a same chip as other portion of the NVM controller), write/program bandwidth to the NVM is limited due to limited size of the (on-chip) buffer. For example, the write bandwidth is limited to the size of the buffer divided by an average of time required to complete writing/programming of the NVM. In some scenarios, the write bandwidth is further limited due to variations in the time required to complete writing/programming of the NVM.

In other embodiments, the buffer is implemented separately from the NVM controller, such as via or one or more separate memory components, such as one or more DRAM chips. For example, the buffer is implemented as all or any portions of (optional) Card Memory 112C of FIG. 1B. In some embodiments implementing the buffer as separate memory components (such as via DRAMs), write/program bandwidth to the NVM is limited due to write bandwidth to the DRAM. For example, the write bandwidth to the NVM is limited to be no greater than the write bandwidth to the DRAM.

In various embodiments, it is an objective to write/program the NVMs at the maximum bandwidth the NVMs are enabled to provide, independently of a size of an (on-chip) buffer or bandwidth to (off-chip) memory components. Computation and temporary storage of various higher-level redundancy information (e.g. RASIE-1, RASIE-2, or any cross-page ECC scheme) enables writing/programming the NVMs at the maximum bandwidth the NVMs are enabled to provide. Rather than storing a copy of all of the data in-program of being written/programmed to the NVMs, higher-level redundancy information is stored instead. Advantageously, size of the higher-level redundancy information stored is related to how many failures recovery is enabled for, rather than how much data is being covered by the higher-level redundancy information.

Conceptually, while writing into a stream of NVM die (e.g., an R-block), higher-level redundancy information (e.g. some form of RASIE) is maintained internally for the stream. The higher-level redundancy information is maintained on a convenient granularity (e.g. one or more pages or one or more blocks) of the NVMs, chosen to be sufficient to cover all in-progress write/program operations with the higher-level redundancy information that is internally maintained. Optionally, all of any portions of the higher-level redundancy information are written/programmed to the NVMs (such as described by and with respect to any one or more of FIG. 7 or FIG. 8, e.g. 807 of FIG. 8). The internally maintained higher-level redundancy information is used to recover from write/program failures (if any). In various embodiments including a non-volatile memory controller implemented as one or more chips, the internal maintaining of the higher-level redundancy information is at least in part via storage in one or more (on-chip) memory elements that are included in one or more of the chips of the memory controller (e.g. all or any portions of Buffer 131 of SSD Controller 100 of FIG. 1A). In some embodiments, the internally maintained higher-level redundancy information is written/programmed to the NVMs even if there are no failures of write/program operations, this protecting data stored in the NVM from (e.g. relatively longer term) failures, such as accumulating errors due to read disturb or retention phenomena.

In some usage scenarios, program failures are relatively infrequent, and RASIE-1 is used. In some usage scenarios, program failures are more frequent and/or higher reliability is desired, and RASIE-2 is used. As an example using RASIE-2, rather than buffering data for 32 NVM die, buffering RASIE-2 for 2 NVM die is performed, a 16× savings of buffering space. As soon as write/program data has been sent to an NVM die and the sent data has been accounted for in an ongoing RASIE-2 computation, buffers associated with the sent data are freed. In some usage scenarios and/or embodiments, the buffers are freed well before completing of the writing/programming associated with the data held in the buffers before the freeing. Thus buffer tenure is reduced and is eliminated as a bottleneck to NVM write/program bandwidth.

Using RASIE-2, as long as there are less than two simultaneous write/program failures in one 'stripe' (e.g. in one RASIE accumulation group), RASIE-2 techniques enable full correction of the write/program failures by reading back previously written/programmed pages in the stripe. The full correction is enabled whether or not an entire R-block row has been completed, as only data used for the RASIE accumulation up to the point of the failure is used (along with the RASIE information accumulated up to the point of the failure).

Other embodiments are contemplated. For example, in some embodiments where accumulated RASIE information is not written to the NVMs, a 'rolling' RASIE is used where pages are accumulated into ('added' to) the RASIE information upon beginning writing/programming the pages to the NVMs, and accumulated out of ('subtracted' from) the RASIE information upon successful completion of the writing/programming of the pages. Thus only a single RASIE accumulation buffer is used for all in-progress write/program operations.

In some embodiments, RASIE information is internally maintained as if it were to be written to the NVMs (whether it is or not) on an R-block row basis. Thus RASIE accumulation storage buffers are used for each in-progress row. If the RASIE information is written to the NVMs, then the RASIE accumulation storage buffers serve two purposes: (1) internal RASIE accumulation for recovery from write/program failures; and (2) RASIE information for writing/programming to the NVMs. According to various embodiments, the internally maintained RASIE information is sufficient to correct one or more of: (a) a specified number of failures of write/program operations; (b) a specific number of uncorrectable ECC errors in a stripe; and (c) the sum or the maximum of (a) and/or (b).

In various embodiments, internally maintained RASIE information for recovery from write/program failures is different than RASIE information for writing/programming to the NVMs (e.g. to recover from failures of lower-level redundancy during reads of the NVMs). For example, the internally maintained RASIE information is RASIE-2 information (enabling recovery from up to two simultaneous write/program failures), and the RASIE information for writing/programming to the NVMs to RASIE-1 information (enabling recovery from a single lower-level redundancy read failure). In further embodiments, the RASIE information for writing/programming to the NVMs is a subset of the internally maintained RASIE information.

In the case of write/program failures, the failing locations are known, and therefore use of erasure-correcting schemes are enabled, and are used in some embodiments. In other embodiments, non-erasure correcting schemes (e.g. general ECC schemes) are used.

Figure 16:
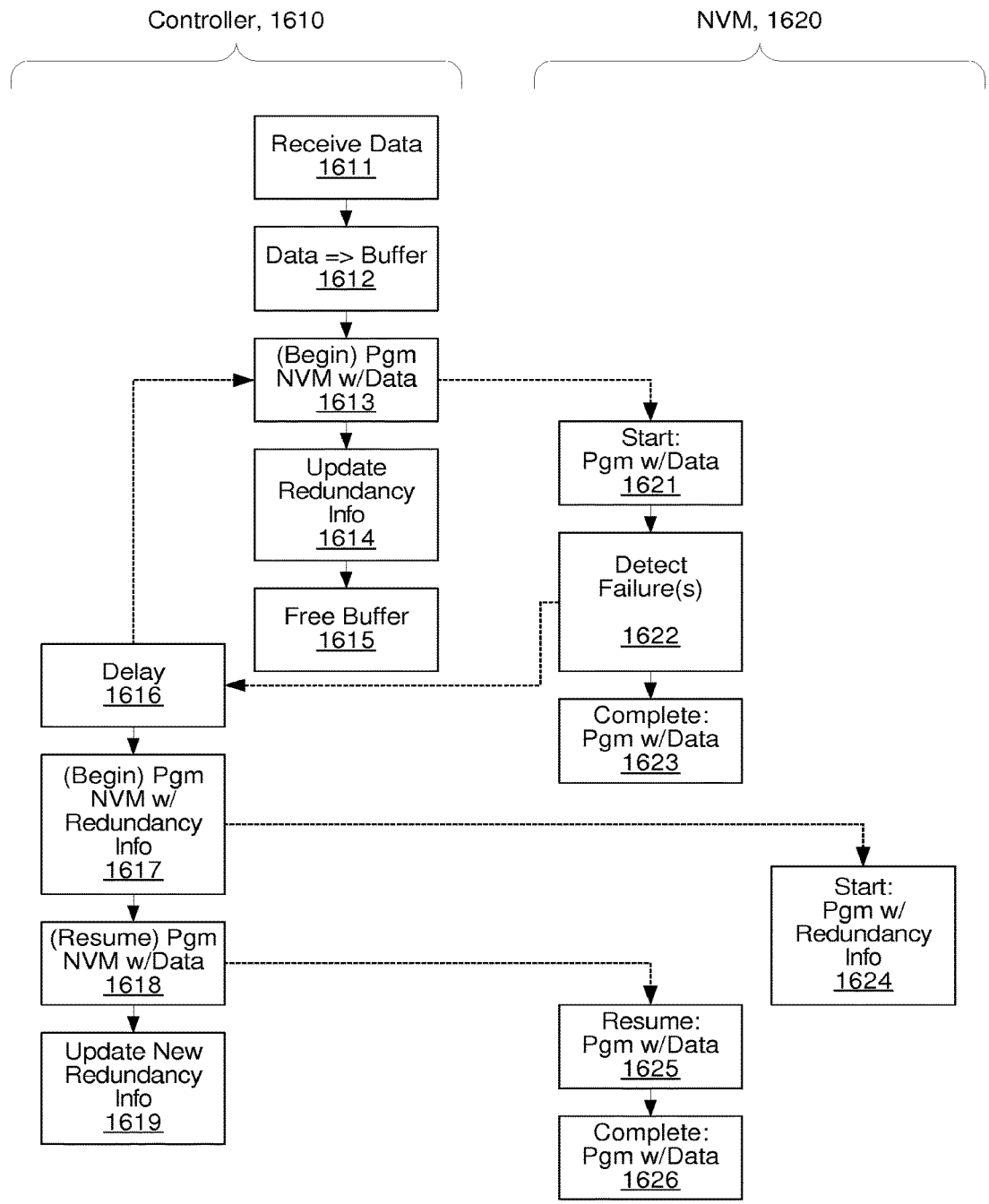
FIG. 16 illustrates selected details of an embodiment of NVM failure recovery via redundant arrays.

FIG. 16 illustrates selected details of an embodiment of NVM failure recovery via redundant arrays. The figure illustrates operations performed by an NVM controller (Controller 1610) and operations performed by the NVM (NVM 1620). An example of the Controller is an SSD controller (such as illustrated by SSD Controller 100 of FIG. 1A). An example of the NVM is a plurality of flash die (such as illustrated by NVM 199 of FIG. 1A).

In the following, the term 'program' (and respective variations thereof) is synonymous with 'write/program' (and respective variations thereof) as well as 'write' (and respective variations thereof) when used in a context of a write to an NVM.

Programming of data to the NVM begins with the Controller being provided with and/or producing data (Receive Data 1611) to be programmed into the NVM. Then the data is stored into a buffer (Data⇒Buffer 1612). Subsequent (or alternatively concurrently, in some embodiments), the Controller sends a request to program the data to the NVM (Begin) Program of NVM with Data 1613). In response, the NVM initiates programming the data into the NVM (Start: Program with data 1621). Meanwhile, the Controller proceeds to accumulate higher-level redundancy information in accordance with the data (Update Redundancy Information 1614). Subsequent to the data being consumed by the accumulation of higher-level redundancy information, the Controller releases the buffer (Free Buffer 1615), such as for re-use to store subsequently received data to be programmed to the NVM. The release of the buffer is independent of how far the requested programming of the NVM has progressed.

Meanwhile, and independent of the release of the buffer, the NVM continues the requested programming of the data, including determining it there are any failures of the programming (Detect Failure(s) 1622). If there are no failures, then the NVM eventually finished the requested programming (Complete: Program with Data 1623); and processing is over with respect to programming of the data. The Controller and the NVM are then free to program additional data to the NVM, e.g. by repeating 1611 and so further (not illustrated).

If there are any failures detected, then in response the Controller optionally and/or selectively delays the requested programming of further data (Delay 1616). The Controller then sends a request to program the accumulated higher-level redundancy information to the NVM (Begin) Program of NVM with Redundancy Information 1617). In response, the NVM initiates programming the accumulated higher-level redundancy information to the NVM (Start: Program with Redundancy Information 1624).

The Controller then proceeds to request (conceptual) resumption of programming of the further data that was previously delayed (Resume) Program of NVM with Data 1618). The resumption is conceptual in that strictly speaking, the previously requested programming is, in various embodiments, suspended, interrupted, and/or stopped, and thus the resumption is respectively variously a continuation, a return to interrupted operations, and/or an entirely new programming operation. The request is to a location different than the location that previously failed (e.g. a different block of the NVM). Data provided with an/or associated with the resumption request includes data that is determined based at least in part on the accumulated redundancy information and any portions of the data successfully programmed into the NVM before the failure. In various embodiments, determining data otherwise lost due to the programming failure is via techniques such as described by and with respect to any one or more of FIGS. 13A-D. In response to the resumption request, the NVM initiates programming of the remaining data into the NVM (Resume: Program with Data 1625).

Meanwhile, the Controller proceeds to accumulate new higher-level redundancy information in accordance with the data associated with the requested resumed programming (Update New Redundancy Information 1619). Eventually the NVM finishes the requested resumed programming (Complete: Program with Data 1626). Although not specifically illustrated, in various embodiments the NVM operates to detect failures of the programming of the higher-level redundancy information as well as the resumed programming of the data.

In various embodiments and/or usage scenarios, the buffer is released (Free Buffer 1615) immediately upon and/or in response to completion of the accumulation of the higher-level redundancy information (Update Redundancy Information 1614). In various embodiments and/or usage scenarios, the buffer is released (Free Buffer 1615) irrespective of how far programming of data stored in the buffer has progressed (Start: Program with Data 1621), (Detect Failure(s) 1622), and (Complete: Program with Data 1623). In various embodiment and/or usage scenarios, the accumulated higher-level redundancy information is retained (not specifically illustrated) until programming of data covered by the accumulated higher-level redundancy information is completed (Complete: Program with Data 1623). In further embodiments, the accumulated higher-level redundancy information is retained (not specifically illustrated) until programming of the accumulated higher-level redundancy information is completed.

In some embodiments, a window (such as based on data and/or time) is reduced and/or minimized with respect to vulnerability to failures other than programming failures (e.g. a power failure). For example, in response to and as soon as a programming failure is detected, all accumulated higher-level redundancy information is programmed to the NVM as quickly as possible. The accumulated higher-level redundancy information that is programmed to the NVM is then available subsequent to a power failure, enabling computation of any data otherwise lost due to the program failure. In other embodiment, in response to a programming failure, the accumulated higher-level redundancy information, in conjunction with any properly programmed portions of data, are used to determine data otherwise lost due to the program failure. In some embodiments, response to a program failure is postponed until completion of a current programming of data associated with a current higher-level redundancy information quantum (e.g. a RASIE stripe). After completion of the current programming, then either accumulated higher-level redundancy information is programmed to the NVM or data otherwise lost due to the program failure is determined.

In some embodiments, programming of data to NVMs is via one or more NVM interfaces, such as flash memory interfaces (e.g. all or any portions of Device Interfaces 190 and Device Interface Logic 191 of FIG. 1A). In some embodiments, higher-level redundancy information (e.g. as used for recovery from NVM programming failure) is stored in one or more on-chip memory elements (e.g. all or any portions of Buffer 131 of SSD Controller 100 of FIG. 1A) having one or more dedicated interfaces.

In various embodiments, processing of or relating to one or more elements of FIGS. 10-12, 13A-13D, 14A-14B, 15A-15B, and FIG. 16 is performed entirely or in part by one or more elements (or portions thereof) of FIG. 1A. For example, a portion of software execution capabilities of CPU 171 is used to manage higher-level redundancy processing, such as by directing data recovery operations as illustrated by FIG. 12 and FIGS. 13A-13D. For another example, Data Processing 121 includes hardware elements dedicated to and/or specialized for computation of higher-level redundancy information in accordance with computations such as illustrated in FIG. 11 and/or associated with updating higher-level redundancy information (Update Redundancy Information 1614) and/or (Update New Redundancy Information 1619) of FIG. 16. For yet another example, all or any portions of Allocated Buffer 138 of FIG. 1A corresponds to the buffer that data is stored into (Data⇒Buffer 1612) and freed (Free Buffer 1615) as described with respect to FIG. 16.

Example Implementation Techniques

In some embodiments, various combinations of all or any portions of operations performed by a system implementation program failure recovery for NVMs (e.g. flash memories, such as NAND flash memories), a computing-host flash memory controller, and/or an SSD controller (such as SSD Controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processings by a computer systems. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-customer technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments, some, all, or various portions of the program instructions are realized as one or more functions, routines, sub-routines, in-line routines, procedures, macros, or portions thereof.

CONCLUSION

Certain choices have been made in the description merely for convenience in preparing the text and drawings, and unless there is an indication to the contrary, the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are may embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, actions, and function elements are variable according to various embodiments. Also, unless specifically stated to the contract, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (e.g., generally dedicated circuitry) or software (e.g., via storage manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations use of different operating system and other system software, use of different interface standards, network protocols, or communication links; and other variations to be expected when implementing the concepts described herein in accordance with the unique engineering and business constraints of a particular application.

The embodiments have been described with detail and environment context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
   beginning, by a storage controller, a programming of particular data stored in an allocated buffer to a particular one of a plurality of non-volatile memories (NVMs);
   updating redundancy information based on the particular data, the redundancy information sufficient to recover from failures of the plurality of NVMs;
   upon updating the redundancy information, freeing the allocated buffer storing the particular data prior to and independent of completing the programming of the particular data to the particular one of the plurality of NVMs;
   continuing the programming of the particular data to the particular one of the plurality of NVMs independent of the freeing the allocated buffer;
   determining whether there are any failures in the programming of the particular data to the particular one of the plurality of NVMs; and
   upon determining there is a failure in the programming of the particular data to the particular one of the plurality of NVMs, utilizing the redundancy information to recover from the failure in the programming.

2. The method of claim 1, further comprising, preceding the beginning of the programming, receiving, at the storage controller, data to program portions of the plurality of NVMs, the data comprising the particular data to program to the particular one of the of the plurality of NVMs.

3. The method of claim 1, wherein the redundancy information is first redundancy information, and further comprising:
   updating second redundancy information different from the first redundancy information and sufficient to recover from failures of a subset of the plurality of NVMs, the updating of the second redundancy information being in response to detecting the failure of the programming of the particular data.

4. The method of claim 3, wherein the particular data is stored as encoded in the first redundancy information when the failure of the programming is detected.

5. The method of claim 1, wherein the allocated buffer resides in a buffer memory of the storage controller.

6. The method of claim 1, wherein the allocated buffer is comprised in a first chip that is separate from a second chip that comprises the storage controller.

7. The method of claim 1, wherein the storage controller is operable as a solid-state disk controller enabled to communicate with a computing host at least in part via a computing host interface compatible with a storage interface standard.

8. The method of claim 1, wherein utilizing the redundancy information to recover from the failure in the programming comprises beginning a programming of the redundancy information to one or more of the plurality of NVMs.

9. A storage system comprising:
   a plurality of non-volatile memories (NVMs); and
   a storage controller communicatively coupled to the plurality of NVMs, the storage controller configured to
      begin a programming of particular data stored in an allocated buffer to a particular one of the plurality of NVMs;
      update redundancy information based on the particular data, the redundancy information sufficient to recover from failures of the plurality of NVMs;
      upon updating the redundancy information, free the allocated buffer storing the particular data prior to and independent of completing the programming of the particular data to the particular one of the plurality of NVMs;
      continue the programming of the particular data to the particular one of the plurality of NVMs independent of the freeing of the particular data from the allocated buffer;
      determine whether there are any failures in the programming of the particular data to the particular one of the plurality of NVMs; and
      upon determining there is a failure in the programming of the particular data to the particular one of the plurality of NVMs, utilize the redundancy information to recover from the failure in the programming.

10. The storage system of claim 9, wherein preceding the beginning of the programming, the storage controller is further configured to receive data to program portions of the plurality of NVMs, the data comprising the particular data to program the particular one of the of the plurality of NVMs.

11. The storage system of claim 9, wherein the redundancy information is first redundancy information, and wherein the storage controller is further configured to update second redundancy information different from the first redundancy information and sufficient to recover from failures of a subset of the plurality of NVMs, the updating second redundancy information being in response to detecting a failure of the programming of the particular data.

12. The storage system of claim 11, wherein the particular data is stored as encoded in the first redundancy information when the failure of the programming is detected.

13. The storage system of claim 9, wherein the allocated buffer resides in a buffer memory of the storage controller.

14. The storage system of claim 9, wherein the storage controller is operable as a solid-state disk controller enabled to communicate with a computing host at least in part via a computing host interface compatible with a storage interface standard.

15. The storage system of claim 9, wherein the storage controller comprises a flash memory interface enabled to communicate with the plurality of NVMs.

16. The storage system of claim 9, wherein the plurality of NVMs comprise one or more flash memories.

17. The storage system of claim 9, wherein utilizing the redundancy information to recover from the failure in the programming comprises beginning a programming of the redundancy information to one or more of the plurality of NVMs.

18. The storage system of claim 13, wherein the redundancy information is maintained in the buffer memory of the storage controller.

19. A non-transitory computer readable medium having processor-executable instructions stored thereon that, when executed by a processor, cause the processor to:
    begin a programming of particular data stored in an allocated buffer to a particular one of a plurality of non-volatile memories (NVMs);
    update redundancy information based on the particular data, the redundancy information sufficient to recover from programming failures of the plurality of NVMs;
    upon updating the redundancy information, free the allocated buffer storing the particular data prior to and independent of the particular one of the plurality of NVMs completing the programming; and
    continue programming the particular data independent of the freeing the allocated buffer.

20. The non-transitory computer readable medium of claim 19, wherein the processor is located in a storage controller that is operable as a solid-state disk controller enabled to communicate with a computing host at least in part via a computing host interface compatible with a storage interface standard.

* * * * *